United States Patent
Guo

(10) Patent No.: US 9,966,242 B2
(45) Date of Patent: May 8, 2018

(54) HIGH THROUGHPUT VACUUM DEPOSITION SOURCES AND SYSTEM

(71) Applicant: Xinsheng Guo, Palo Alto, CA (US)

(72) Inventor: Xinsheng Guo, Palo Alto, CA (US)

(73) Assignee: Xinsheng Guo, Palo Alto, CA (US)

( * ) Notice: Subject to any disclaimer, the term of this patent is extended or adjusted under 35 U.S.C. 154(b) by 368 days.

(21) Appl. No.: 14/672,812

(22) Filed: Mar. 30, 2015

(65) Prior Publication Data
US 2016/0093478 A1     Mar. 31, 2016

Related U.S. Application Data

(60) Provisional application No. 62/057,124, filed on Sep. 29, 2014.

(51) Int. Cl.
| | | |
|---|---|---|
| *H01J 37/34* | (2006.01) | |
| *C23C 14/50* | (2006.01) | |
| *C23C 14/56* | (2006.01) | |
| *C23C 16/458* | (2006.01) | |
| *C23C 16/54* | (2006.01) | |
| *H01J 37/32* | (2006.01) | |

(52) U.S. Cl.
CPC .......... *H01J 37/3488* (2013.01); *C23C 14/50* (2013.01); *C23C 14/505* (2013.01); *C23C 14/568* (2013.01); *C23C 16/458* (2013.01); *C23C 16/54* (2013.01); *H01J 37/32899* (2013.01); *H01J 37/34* (2013.01); *H01J 37/3417* (2013.01)

(58) Field of Classification Search
CPC .. H01J 37/3488; H01J 37/32899; H01J 37/34; H01J 37/342; H01J 37/3417; H01J 37/3414; H01J 37/3411; H01J 37/3435; C23C 14/505; C23C 14/568; C23C 14/50; C23C 16/458; C23C 16/54
See application file for complete search history.

(56) References Cited

U.S. PATENT DOCUMENTS

| | | | | |
|---|---|---|---|---|
| 4,194,962 A * | 3/1980 | Chambers | ............... | C23C 14/56 204/298.16 |
| 4,798,663 A * | 1/1989 | Herklotz | ............... | C23C 14/355 204/192.12 |
| 4,814,056 A * | 3/1989 | Welty | .................... | C23C 14/044 118/720 |
| 6,471,837 B1 * | 10/2002 | Hans | ......................... | B01J 3/03 118/500 |
| 8,101,055 B2 * | 1/2012 | Matsui | .................. | C23C 14/044 118/729 |
| 8,236,152 B2 * | 8/2012 | Guo | ....................... | C23C 14/352 204/298.02 |
| 2007/0012558 A1 * | 1/2007 | White | ..................... | C23C 14/35 204/192.1 |

* cited by examiner

*Primary Examiner* — Michael A Band
(74) *Attorney, Agent, or Firm* — SV Patent Service

(57) ABSTRACT

A high throughput deposition apparatus includes a first process chamber; one or more first deposition sources in the first process chamber; a first main carrier comprising a plurality of first sub-carriers each configured to carry one or more substrate each positioned around an axial direction and configured to receive a first deposition material from the one or more first deposition sources, wherein the first sub-carriers define a curved surface around the axial direction; and a transport mechanism configured to move the first main carrier along the axial direction through the first process chamber.

22 Claims, 26 Drawing Sheets

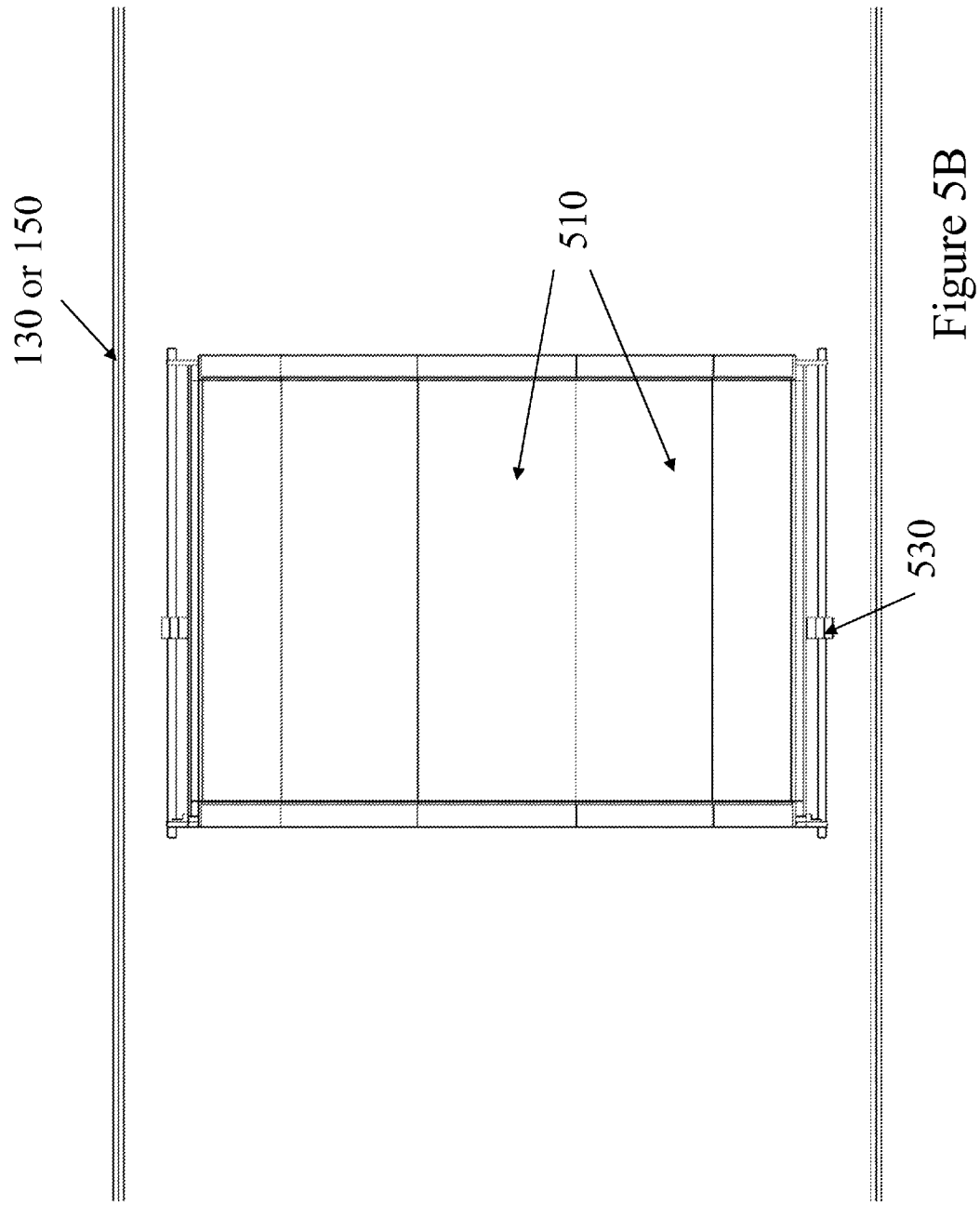

HIGH THROUGHPUT VACUUM DEPOSITION SOURCES AND SYSTEM

BACKGROUND OF THE INVENTION

The present application relates to material deposition technologies, and more specifically to high throughput deposition apparatus.

Material deposition in vacuum is widely used in photovoltaic cells and panels, window glass coating, flat panel display manufacturing, coating on flexible substrates, hard disk coating, industrial surface coating, semiconductor wafer processing, and other applications.

High volume production systems used for these applications typically comprise of interconnected box-shaped chambers that accept one or two rows of substrates. The deposition sources typically have a material usage rates ranging from 20 percent with low cost planar targets to 50% with high cost rotary targets.

There is therefore a need for higher throughput deposition systems that can provide uniform deposition on a higher number of substrates with reduced material waste.

SUMMARY OF THE INVENTION

The present application discloses a high throughput deposition apparatus that reduces equipment cost, improves deposition uniformity, increases number of the substrates in processing chamber, reduces waste of deposition materials, and provides high throughput substrate processing. The operation up time is improved by reducing the need or frequencies of replacing deposition materials and remove broken or dropped substrates.

In one aspect, a cylindrical vacuum envelope can be used because it can stand higher pressure difference than a box envelope, and thus requires thinner walls to hold vacuum pressure and is cheaper to manufacture. It should be noted that conventional deposition systems are constructed with planar or rotary sources and targets. The sources are mounted to a flat surface, which are compatible with rectangular shaped chambers rather than cylindrical chambers.

In one general aspect, the present invention relates to a high throughput deposition apparatus, comprising: a first process chamber; one or more first deposition sources in the first process chamber; a first main carrier comprising a plurality of first sub-carriers each of which can carry one or more substrate each positioned around an axial direction and configured to receive a first deposition material from the one or more first deposition sources, wherein the first sub-carriers define a curved surface around the axial direction; and a transport mechanism that can move the first main carrier along the axial direction through the first process chamber.

Implementations of the system may include one or more of the following. The first main carrier comprises a first rail edge in the axial direction, wherein the transport mechanism can include wheels configured to roll along the first rail edge, which allows the first main carrier to slide along the axial direction. The high throughput deposition apparatus can further include a second main carrier comprising a plurality of second sub-carriers each positioned around the axial direction and configured to receive a first deposition material from the one or more first deposition sources, wherein the transport mechanism is configured to move the second main carrier along the axial direction. The first main carrier and the second main carrier can form a substantially closed loop that defines therein a cylindrical space along an axial direction. The first main carrier and the second main carrier can be separated by a gap aligned along the axial direction. The first main carrier can include a first rail edge in the axial direction, wherein the second main carrier comprises a second rail edge in the axial direction, wherein the first rail edge and the second rail edge are separated by the gap. The high throughput deposition apparatus can further include a deposition shield positioned between the gap on the sides of the first main carrier and the second main carrier opposite to the one or more first deposition sources, wherein the deposition shield is configured to block a portion of the first deposition material from the one or more first deposition sources. The deposition shield can include a web that is moveable by one or more rollers. The one or more first deposition sources can include a sputtering target; and an anode configured to provide an electric potential bias in the sputtering target, wherein the high throughput deposition apparatus can further include an anode shield comprising a web that is moveable by one or more rollers. The first sub-carriers are defined by polygon shaped surfaces positioned around the axial direction. The high throughput deposition apparatus can further include a rotation mechanism configured to rotate at least one of the plurality of first sub-carriers and the associated substrate. At least one of the plurality of first sub-carriers is configured to carry two substrates on two opposing surfaces of the one of the plurality of first sub-carriers. The one or more first deposition sources can include a sputtering target, the high throughput deposition apparatus can further include a cleaning apparatus configured to clean a sputtering surface of the sputtering target, wherein the cleaning apparatus includes a brush, a polishing wheel, a gas blower, or a vacuum cleaner. The high throughput deposition apparatus can further include an entrance load lock chamber; and an entrance buffer chamber that connects the entrance load lock chamber and the first processing chamber, wherein transport mechanism configured to move the first main carrier along the axial direction through the entrance load lock chamber, entrance buffer chamber, and the first process chamber. The high throughput deposition apparatus can further include a first gate valve between the entrance load lock chamber and the entrance buffer chamber, wherein the first gate valve is configured to open to allow the first main carrier to move from the entrance load lock chamber to the entrance buffer chamber, wherein the first gate valve is configured to close to provide vacuum seal between the entrance load lock chamber and the entrance buffer chamber; and a second gate valve between the entrance buffer chamber and the first process chamber, wherein the second gate valve is configured to open to allow the first main carrier to move from the entrance buffer chamber to the first process chamber, wherein the second gate valve is configured to close to provide vacuum seal between the entrance buffer chamber and the first process chamber. At least one of the first gate valve and the second gate valve includes two half circles or half polygons configured to open and close. The high throughput deposition apparatus can further include a heater in the entrance buffer chamber and configured to heat the first sub-carriers in the first main carrier. The high throughput deposition apparatus can further include a second process chamber; and one or more second deposition sources in the second process chamber; wherein each of the first sub-carriers is configured to carry a substrate configured to receive a second deposition material from the one or more second deposition sources, wherein the transport mechanism configured to move the first main carrier along the axial direction through the second process chamber. The high throughput deposition apparatus can further include a process buffer chamber between the first process chamber and the second process chamber, wherein the transport mechanism configured to move the first main carrier along the axial direction through the process buffer chamber. The high throughput deposition apparatus can further include an exit lock chamber; and an exit buffer chamber between the first process chamber and the exit lock chamber, wherein the transport mechanism configured to move the first main carrier along the axial direction through the exit lock chamber and the exit buffer chamber. The one or more first deposition sources can form a substantially closed loop substantially perpendicular an axial direction. The one or more first deposition sources can include magnets that are distributed in a substantially closed loop substantially perpendicular an axial direction. The one or more first deposition sources can include sputtering targets that are distributed in a substantially closed loop substantially perpendicular an axial direction. The one or more first deposition sources can produce vapor for chemical vapor deposition (CVD) or plasma enhanced chemical vapor deposition (PECVD).

These and other aspects, their implementations and other features are described in details in the drawings, the description and the claims.

BRIEF DESCRIPTION OF THE DRAWINGS

FIGS. 5A-5F illustrate exemplified detailed configurations of deposition sources, substrates, and processing chamber compatible with the disclosed high throughput deposition apparatus.

DETAILED DESCRIPTION OF THE INVENTION

Figure 1A:
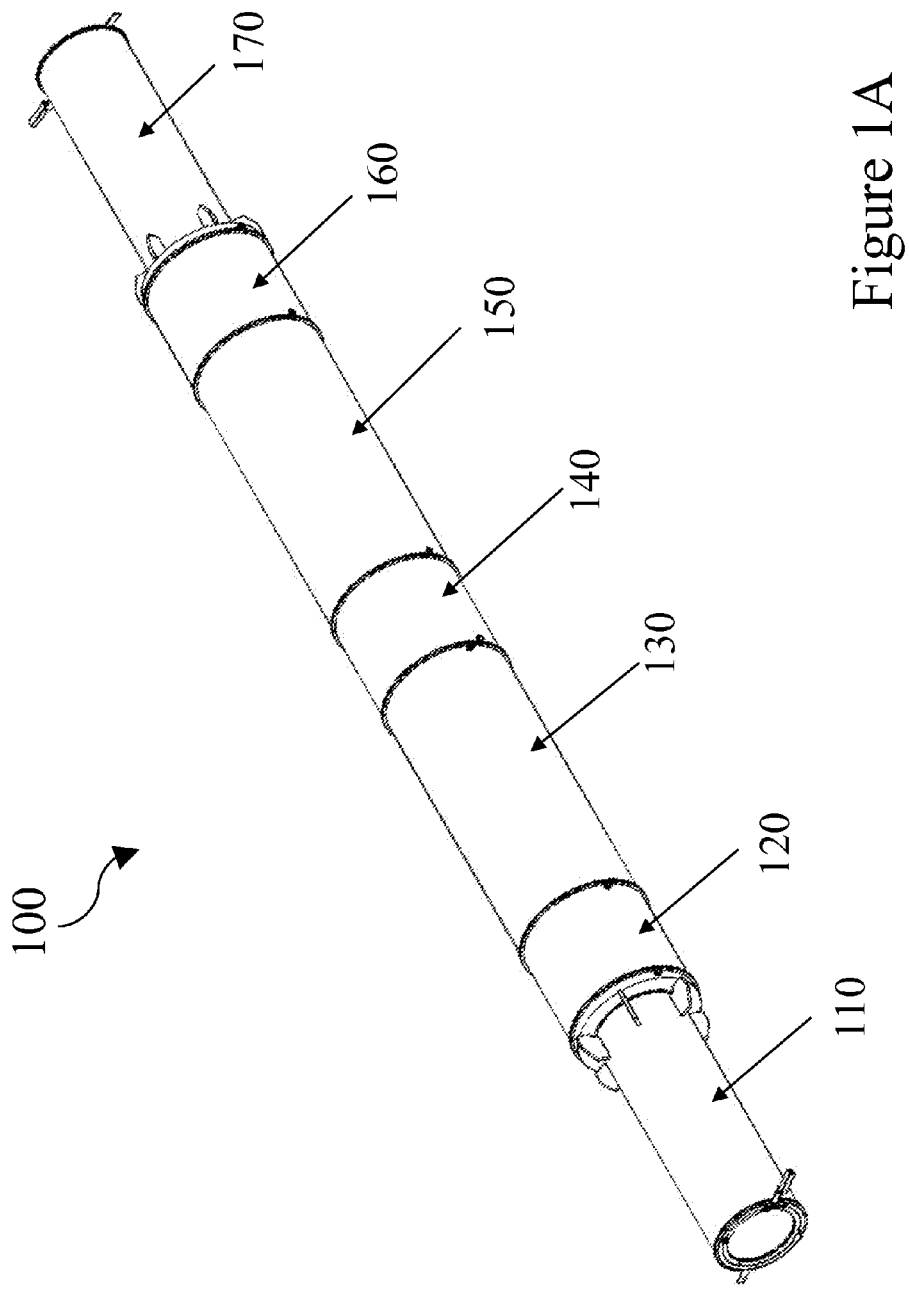
FIG. 1A is a perspective view of a high throughput deposition apparatus in accordance with the present invention.
Figure 1B:
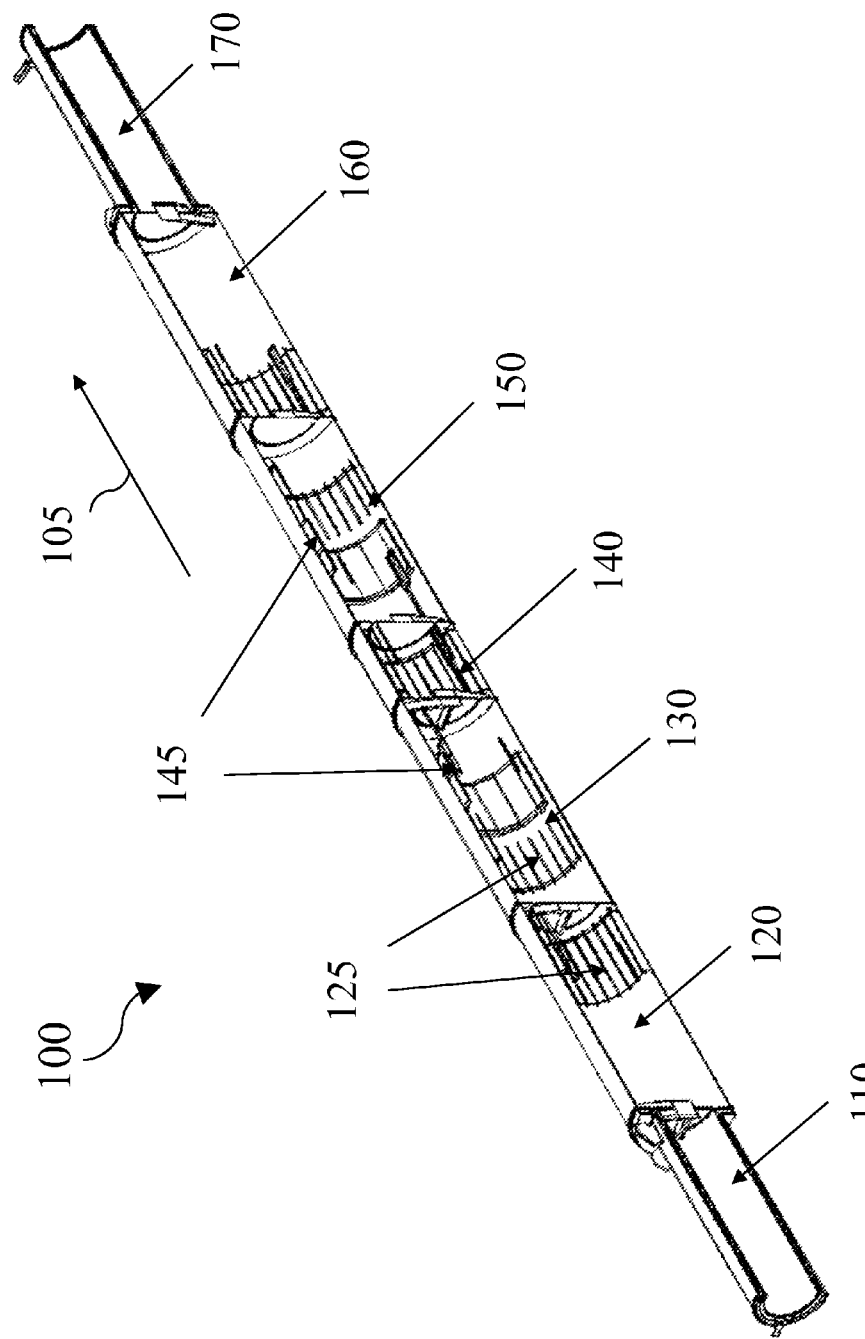
FIG. 1B is a cut-out perspective view of the high throughput deposition apparatus in FIG. 1A.
Figure 1C:
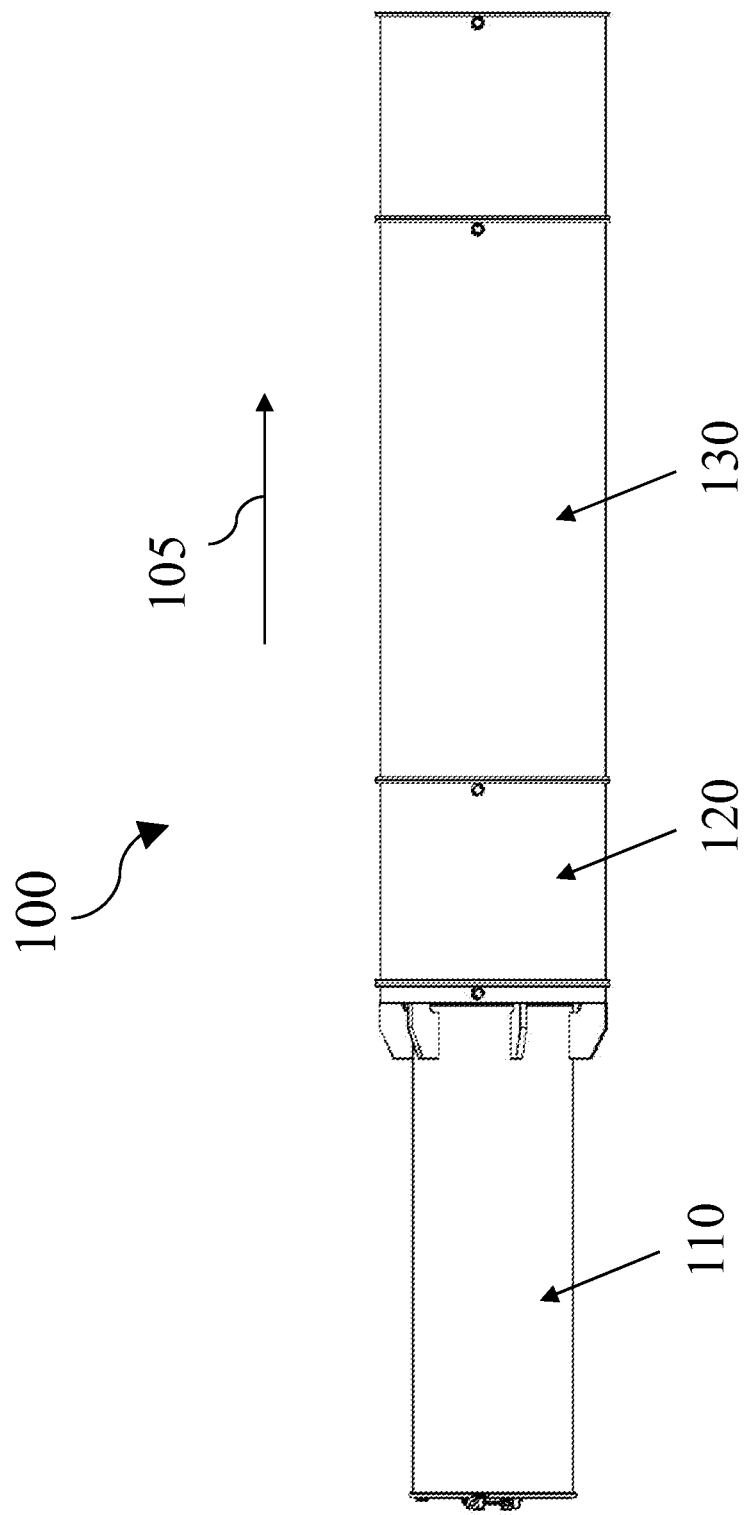
FIG. 1C is a front view of the high throughput deposition apparatus in FIG. 1A.
Figure 1D:
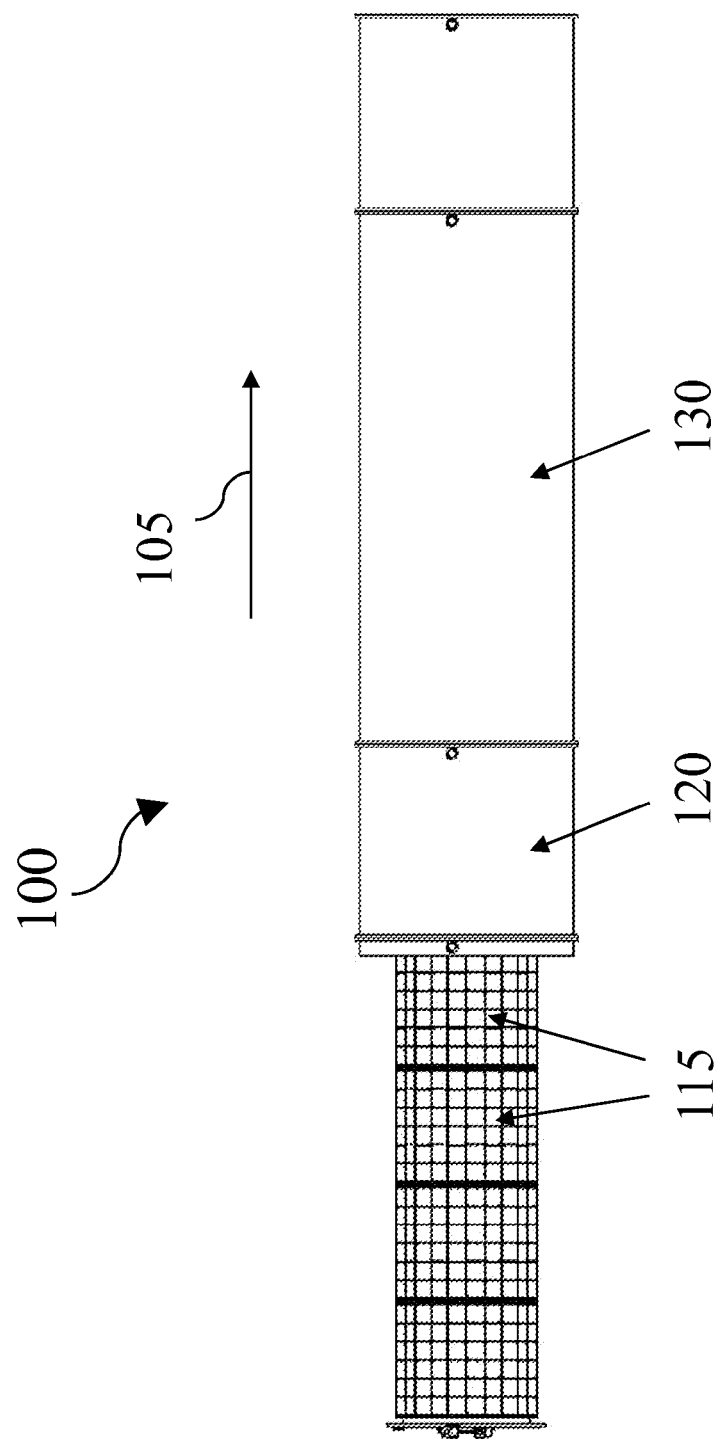
FIG. 1D is a front view of the high throughput deposition apparatus in FIG. 1A without the outer wall and revealing the substrates and subcarriers mounted on main carriers.
Figure 2A:
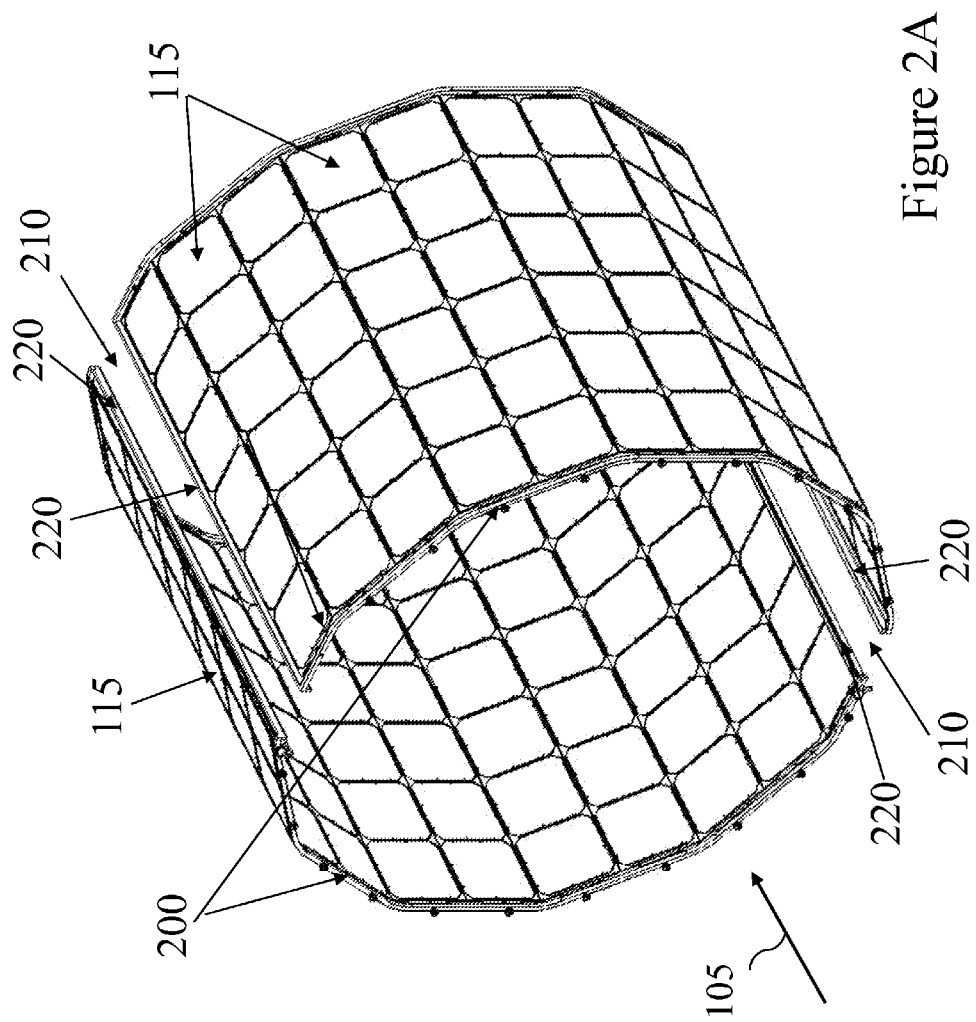
FIGS. 2A-2B illustrate substrates and sub-carriers that are mounted on two main carriers compatible with the disclosed high throughput deposition apparatus.
Figure 2B:
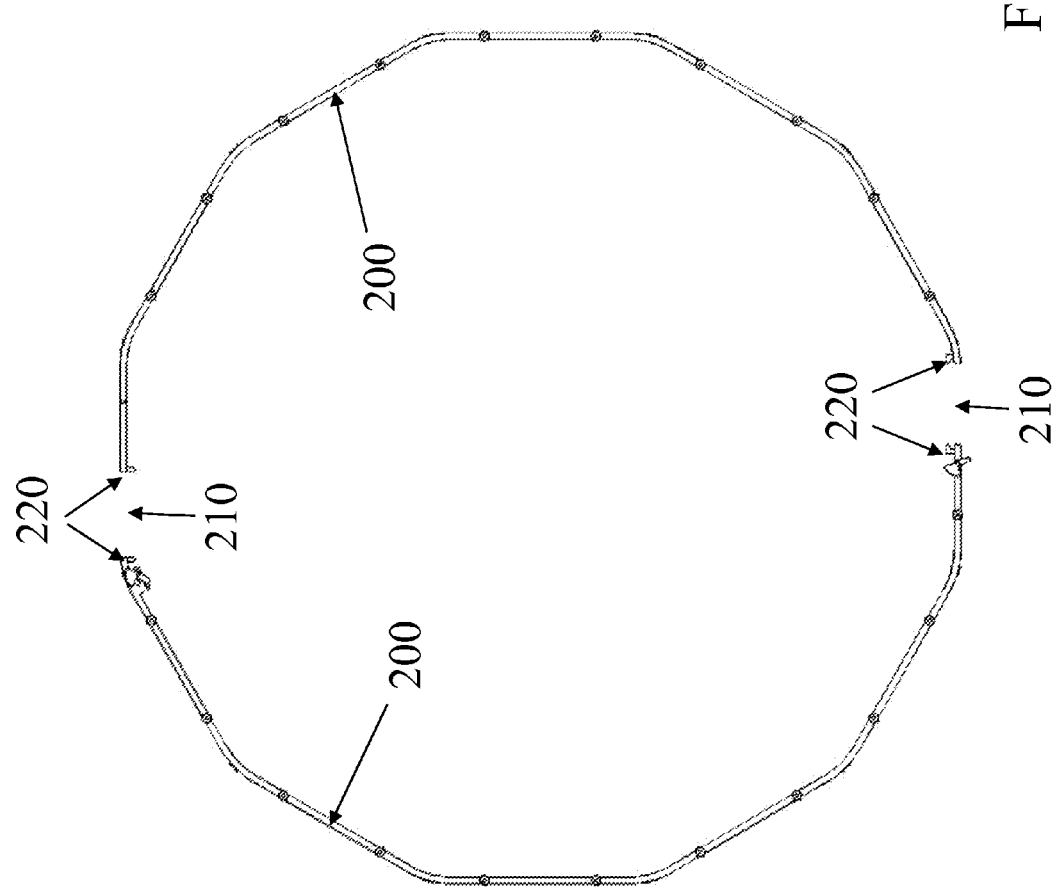

Cylindrical vacuum envelope stands vacuum pressure much better than box envelopes using less wall thickness and is cheaper to manufacture. The present invention uses deposition sources that conform to the shape of cylinder. The substrates are also mounted to carriers that conform to the shape of cylinder.

It is desirable to have as many substrates processed as possible in a vacuum envelope. Deposition sources that forms a closed polygon ring facing substrates also placed in a polygon ring in a different circumference radius can maximize the available deposition area. The deposition area is much larger than conventional one layer planar substrate carrier, by a factor of approximately 3.14.

In a large deposition system, especially one that requires vacuum environment, it is important to have support, valves between atmosphere and vacuum chambers or between process chambers. It is also important to have access to the center region inside the substrate loop. One or more gap in the substrate carrier is needed.

The substrates such as photovoltaic cells, glass, silicon wafers, or other substrates are attached to a substrate carrier. The substrate can be either attached to carrier individually or placed back to back and then attached to carrier to reduce backside deposition and double the amount of substrates processed at a time.

Referring to FIGS. 1A-1D, a high throughput deposition apparatus 100 includes an entrance load lock chamber 110, an entrance buffer chamber 120, a first process chamber 130, an optional process buffer chamber 140, an optional second process chamber 150, an exit buffer chamber 160, and an exit lock chamber 170. The high throughput deposition apparatus 100 also includes heaters 125 and deposition sources 145.

Referring to FIGS. 1D-3A, an array of substrates 115 or sub-carriers 300 are mounted to one or more larger main carriers 200. Each of the main carriers 200 includes a plurality of sub-carriers 300 each configured to carry one or more substrate 115 each positioned around an axial direction 105 and configured to receive a first deposition material from the one or more first deposition sources. The sub-carriers 300 (and thus the substrates 115) together define a curved surface around the axial direction 105. The sub-carriers in the main carriers 200 together can form a substantially closed loop that defines therein a cylindrical space along the axial direction 105. For example, a main carrier 200 can define approximately or slightly less than half a cylindrical surface (about spanning 180 degrees or slightly less than 180 degrees). The main carriers 200 can have rail edges 220 for transporting the main carriers 200 along the axial direction 105. The rail edges 220 of two adjacent main carriers 200 can be separated by gaps 210 that are aligned in the axial direction 105. The surfaces of the main carriers and the substrates on the carriers are substantially parallel to the axial direction 105. The gaps 210 are necessary to support structures such as gate valves (FIG. 4C as described below), substrate transport systems (FIGS. 3A-3B as described below), and to allow access to the inner regions of the vacuum chambers (110-170 in FIGS. 1A-1D). Two such main carriers 200 form almost a closed loop. The main carriers 200 move individually through the entrance load lock chamber 110, the entrance buffer chamber 120, the first process chamber 130, the optional process buffer chamber 140, the optional second process chamber 150, the exit buffer chamber 160, the exit lock chamber 170 (FIGS. 1A-1D), and gate valves (FIG. 4C as described below). The main carriers 200 can also be moved together in the form of a closed loop during deposition or other processing steps such as heating or plasma etching to increase deposition efficiency.

The deposition sources can include sputtering targets and magnets used for physical vapor deposition. The deposition sources can also produce vapor for chemical vapor deposition (CVD) or plasma enhanced chemical vapor deposition (PECVD).

The deposition sources can also be distributed in a closed loop without an end in circumference. The closed loop can be substantially perpendicular to the axial direction 105. Such deposition sources can enable better deposition uniformity and improve capturing efficiency of deposition materials on substrates. Substrates receive substantially similar deposition condition, regardless where they are placed on the substrate carrier. A closed loop deposition sources minimize the edge effects in sputtering, CVD, and PECVD, and increase deposition material utilization. In case of plasma enhanced deposition such as sputtering deposition and PECVD, a closed loop deposition sources allow electrons to travel in a closed loop with the aid of magnetic field and substantially increase operating plasma density and reduce operating pressure.

Figure 3A:
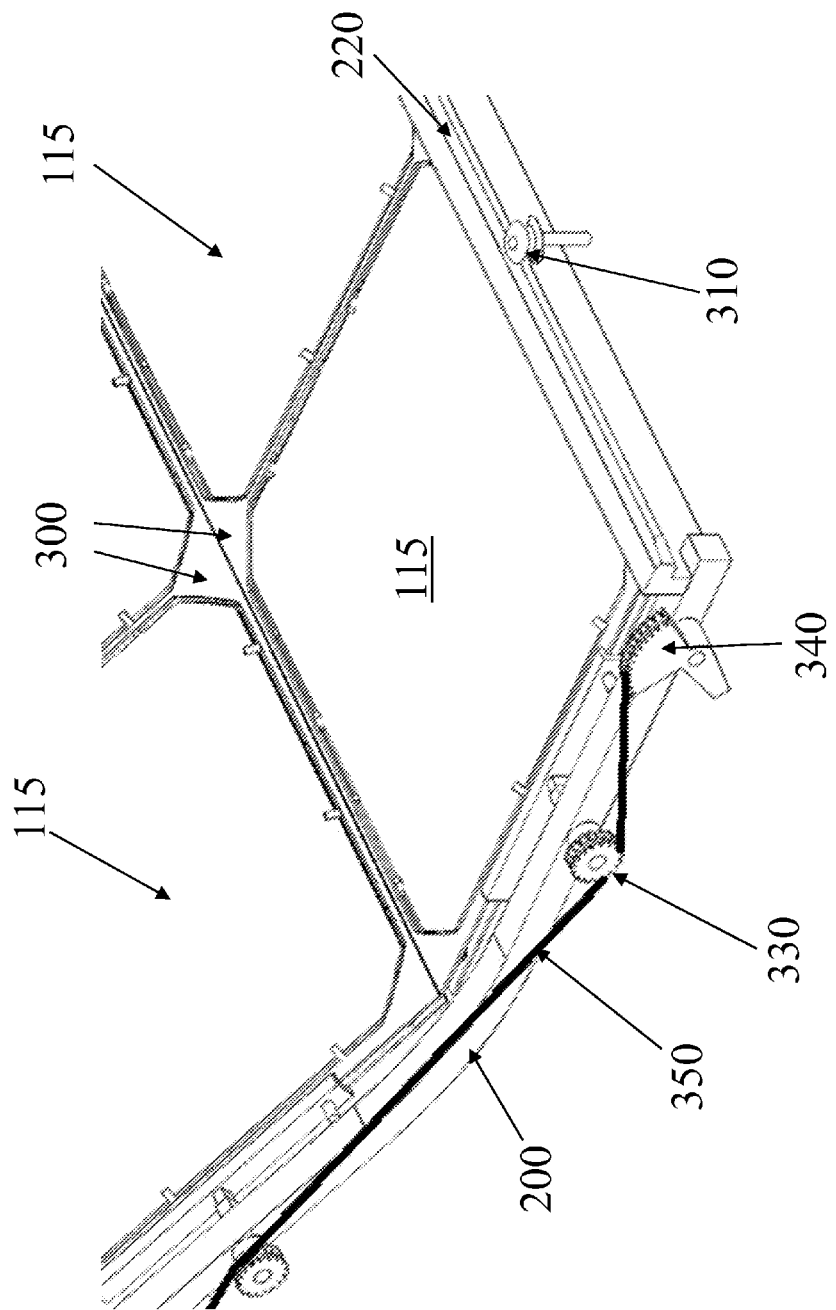
FIG. 3A-3B illustrate exemplified transport mechanisms for the main carriers compatible with the disclosed high throughput deposition apparatus.
Figure 3B:
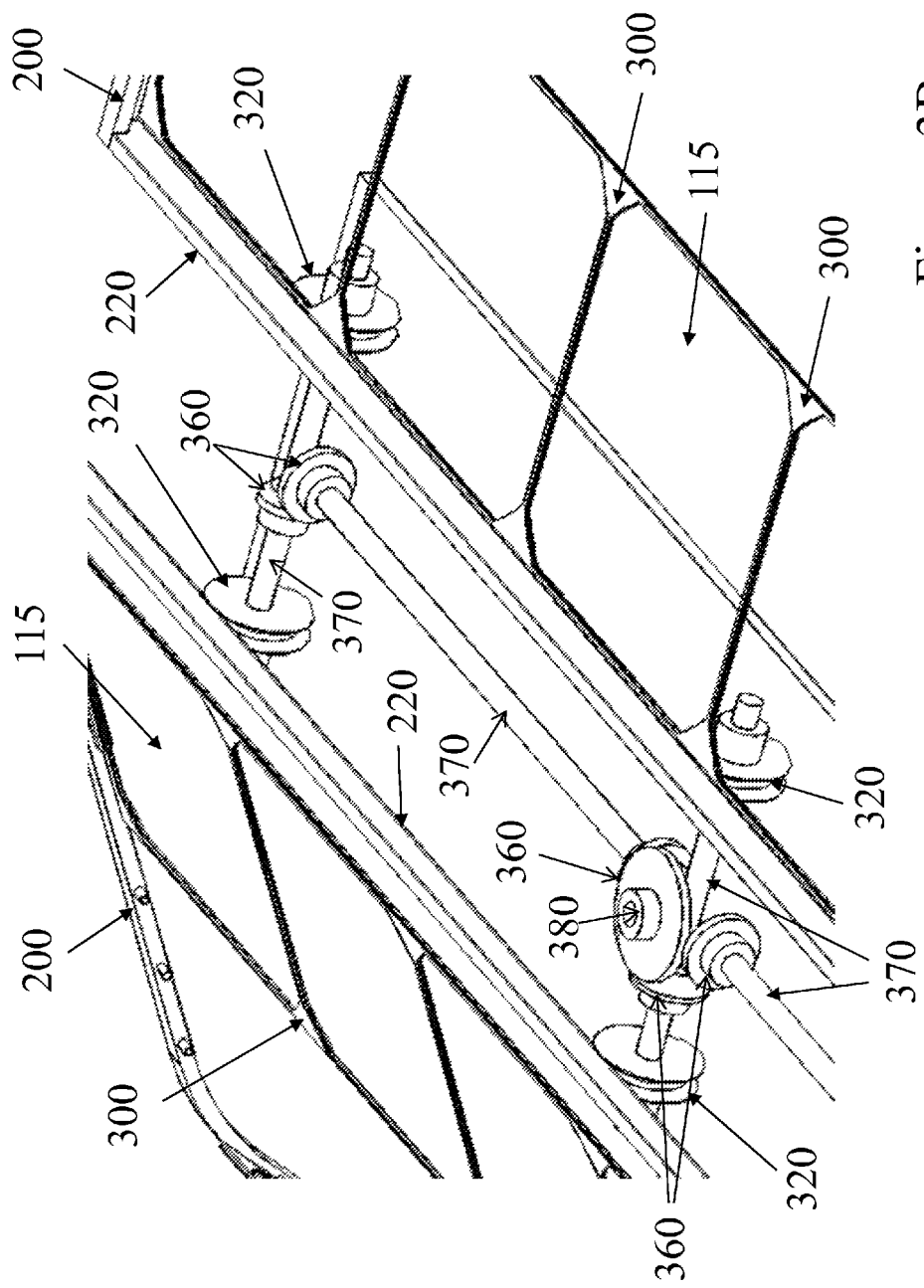

FIG. 3A shows a lower portion of an exemplified mechanism for mounting sub-carriers 300 to a large main carrier 200. FIG. 3B shows an upper portion of an exemplified mechanism for mounting sub-carriers 300 to larger main carrier 200. Each sub-carrier 300 is configured to hold one or a group of substrates 115. The sub-carrier 300 can be mounted to two axes 330 at each end that can rotate at least 180 degrees to expose either the front or the back of the sub-carriers 300 to the deposition sources. The sub-carriers 300 on the main carrier 200 can for example be rotated by a gear 340 to rotate all the axes 330 linked by the chain 350. The rail edges 220 rest on wheels 310 and 320, and can have tapered shape for aligning the main carrier 200 with the wheels 310 to improve reliability and reduce impact forces. Some or all of the wheels 320 can be driven by motors to move the main carrier 200 through the deposition system, while the rest of the wheels 310 can be passive and serve only as support for the carrier 200.

The main carrier 200 can move on the wheels 310, 320 throughout different chambers in the high throughput deposition apparatus 100. Referring to FIG. 3B, the wheels 320 can be mounted to the deposition system and chambers and move the liner tracks 220 on the main carrier 200. One configuration is to drive the main carrier 200 using top wheels 320 and support the lower rail edge 220 with horizontal forces using passive wheels 310 shown in FIG. 3A. To save cost and also to ensure synchronized motion, some of the driving wheels 320 can be linked by gears 360 and rods 370. A motor and its driving shaft (not shown here) can drive the drive gear 380 and transfer motions to all linked wheels 320.

Figure 4A:
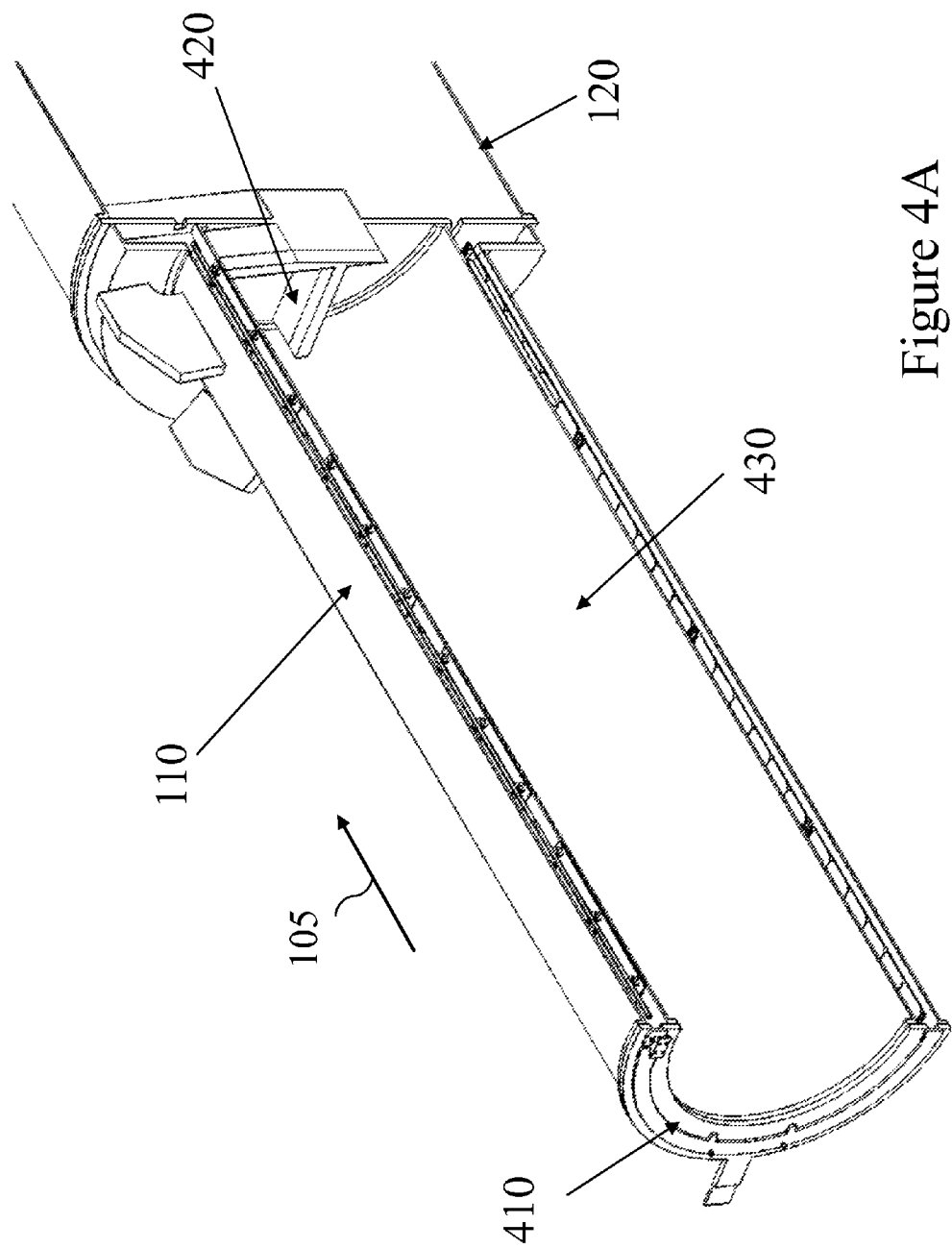
FIGS. 4A-4D illustrate exemplified valve mechanisms for providing vacuum in the processing chambers compatible with the disclosed high throughput deposition apparatus.
Figure 4B:
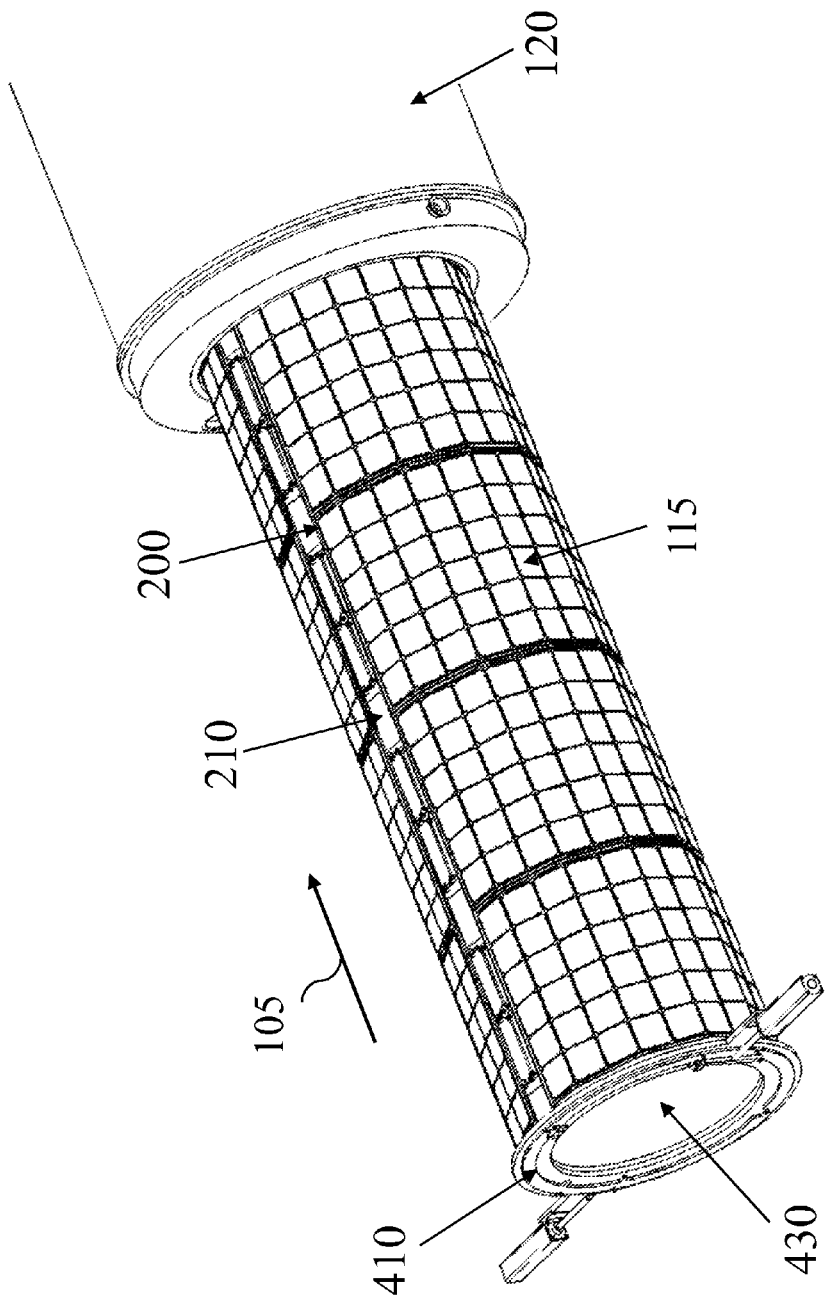
Figure 4C:
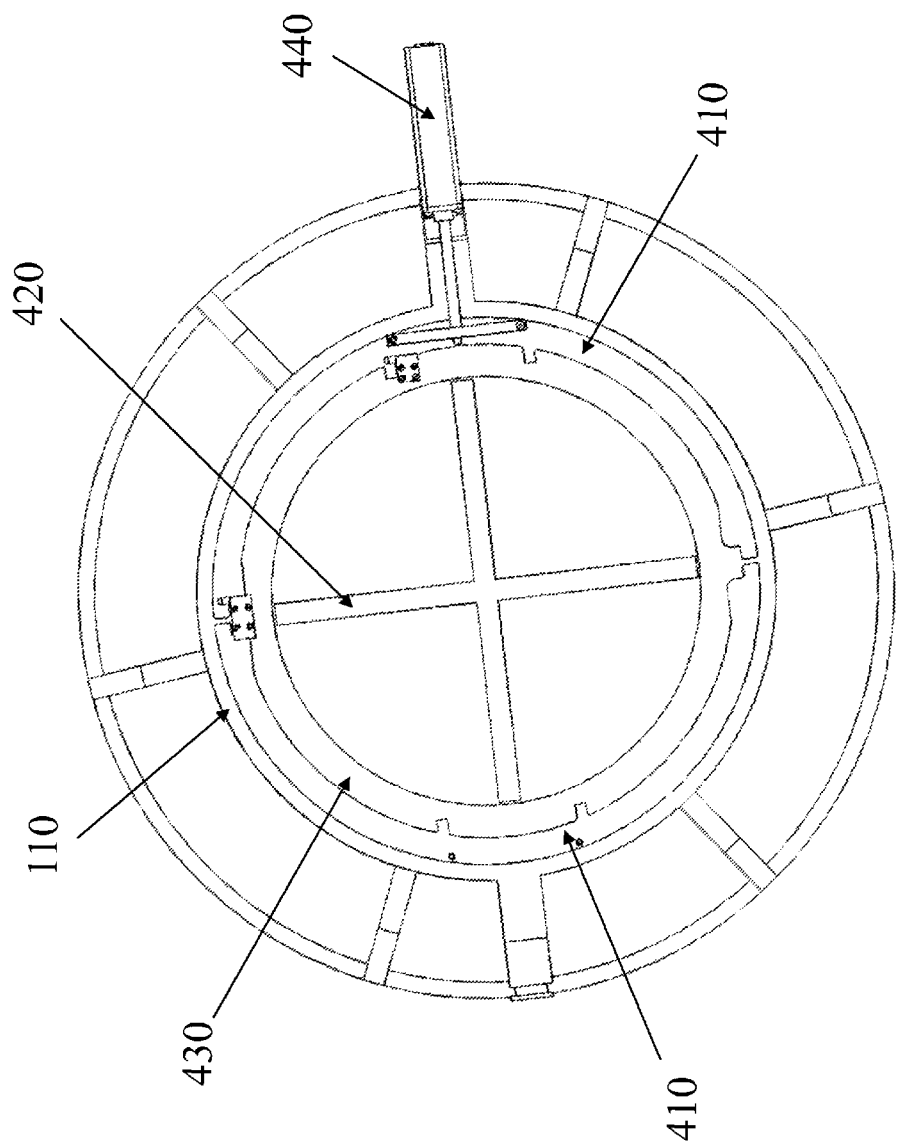

Referring to FIG. 4A-4B, the load lock chamber 110, the entrance buffer chamber 120, and the deposition chambers (not shown) can be cylinder shaped, or oval shaped. The thickness required to stand vacuum force is much less than box shaped vacuum chamber, thus saving cost on material. The cylindrical chambers are simpler to fabricate and requires much less welding. At least two gate valves 410 are used to isolate the process environment from atmosphere or other process environment for each chamber interface. The gate valves 410 includes a pair of half circles or arcs or half polygons that can be opened and closed. The material and valve reinforcement 420 between the gate valves 410 ensure the dimensional integrity of the chamber interface under vacuum pressure. The gaps 210 between main carriers 200 accommodate the material and the valve reinforcement 420 during movements of the main carriers 200 through the high throughput deposition apparatus 100. The gate valves 410 are placed between atmosphere and the load lock chamber 110, the load lock chamber 110 and buffer chamber 120, the entrance buffer chamber 120 and the process chamber 130, and optionally between the process chambers 130, 150. An optional inner load lock chamber 430 can be constructed to reduce the volume of the load lock chamber 110 and decrease the time required to pump down the load lock chamber 110. Since the load locks are pumped and vented very often in a high throughput vacuum deposition system, the time saving can significant increase the system throughput. Each gate valve 410 includes a plate that moves in and out of the opening between chambers, and seals the opening by pressing against a flexible seal such as rubber O-ring between the plate and the chambers. A gate valve 410 allows the passage of substrates when the gate is open and isolates the environment in each chamber when the gate is closed.

Figure 4D:
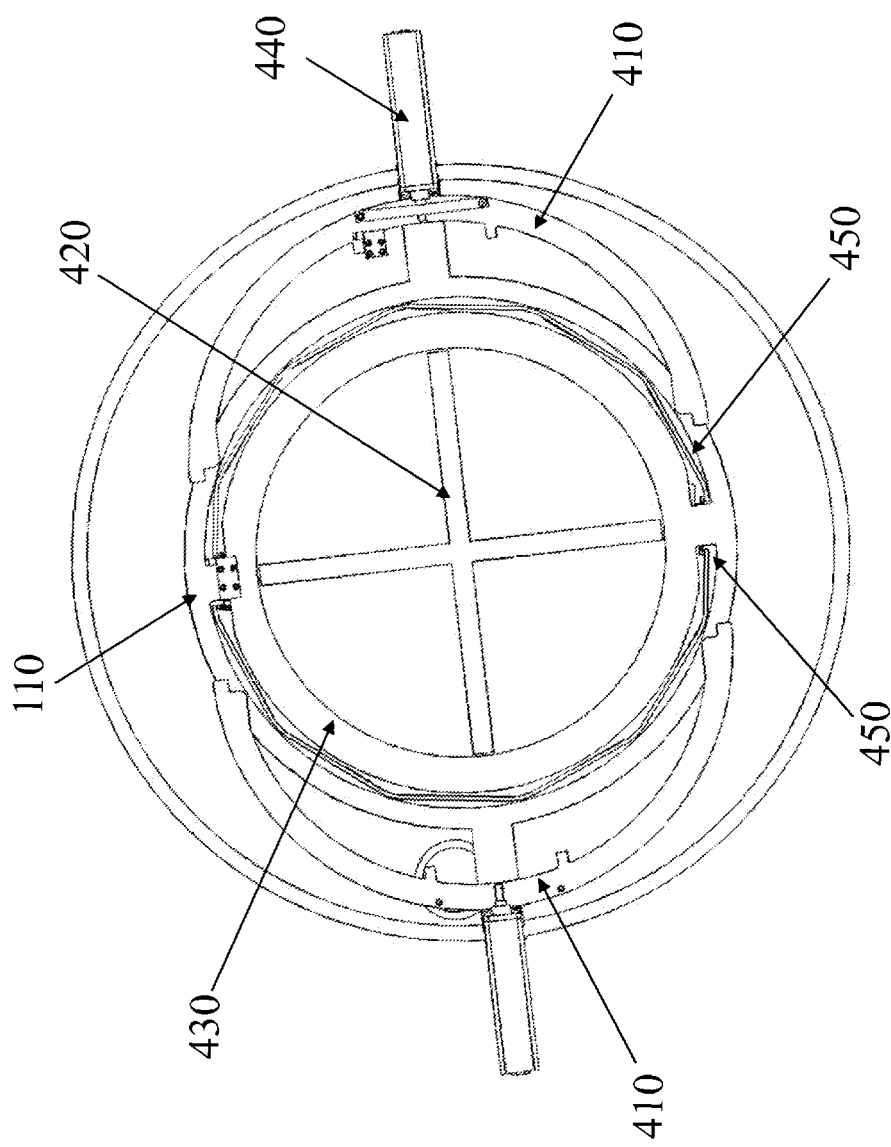

FIG. 4C shows a side view of the gate valve 410 with an actuator 440. The gate valve 410 is moved to outer side to expose the entire gate slits when actuated in as shown FIG. 4D. The gate valve 410 are shaped to accommodate the main carrier 200 in semi-circle or polygon shape, and can be moved out of the valve opening 450 by the actuator 440 to allow the movement of the main carriers 200 between the chambers (i.e. the entrance load lock chamber 110, the entrance buffer chamber 120, the first process chamber 130, the optional process buffer chamber 140, the optional second process chamber 150, the exit buffer chamber 160, and the exit lock chamber 170). The actuator 440 can be pneumatic cylinder, electrical motor, or other means to provide linear motions, and can provide linear motion directly to the gate valve 410, or through vacuum feed through or vacuum bellow to the gate valve 410. The space inside the gate valve 410 can be enforced to stand atmosphere pressure by welding plates 420 to the gap.

The presently disclosed apparatus allows the vacuum chambers to have inner chambers such as the inner load lock chamber 430 since the center region of the chamber can be empty, as shown in FIG. 4B. The inner chambers reduce the vacuum volume which allows faster pump down and can be used to mount heater, deposition sources, and moving mechanism on the inner chamber surfaces.

Figure 5A:
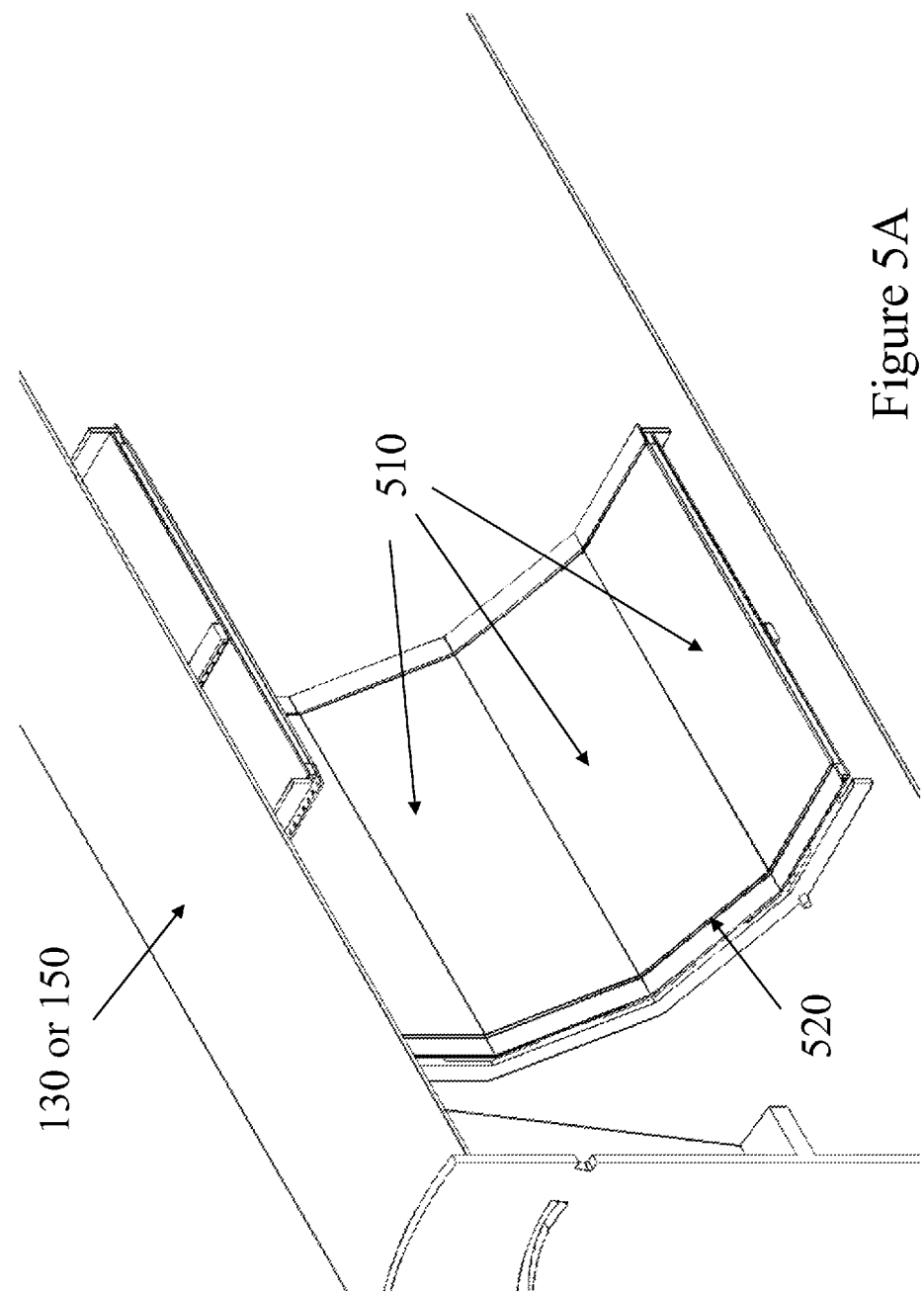

Referring to FIG. 5A, in the first process chamber 130 or the second process chamber 150, multiple deposition sources 510 can be placed close to each other to form a substantially closed loop 520 around substrates mounted on a main carrier (not shown). Each deposition source 510 can be substantially planar to decrease cost. The deposition sources 510 can be sputtering sources, sputtering targets, CVD or PECVD sources, heaters, or gas distribution. In some cases, the individual deposition sources 510 can be replaced by one or more integrated deposition sources, reducing the number of sources and system cost.

A magnetic field by either electrical coil or permanent magnets can enhance plasma density, improves plasma uniformity and decrease operating pressure for sputtering, PECVD, or etching of the substrates. Electrons drift under Lawrence force and electrode voltage or target voltage and form a close loop over the polygon surfaces. The plasma uniformity is better than conventional planar magnetrons where electrons have to form a closed loop over the same planar source. In an alternative setup, individual conventional sputtering sources with closed loop magnetic field formed over same planar source or other individual deposition sources can also form a substantial closed loop or partial closed loop to achieve at least partial benefits of the present invention.

Referring to FIG. 5B, a permanent magnet loop 530 is scanned behind the deposition sources 510, it provides a uniform magnetic field around target surfaces, and uniform target material consumption in most target areas, which increases target utilization.

Figure 5C:
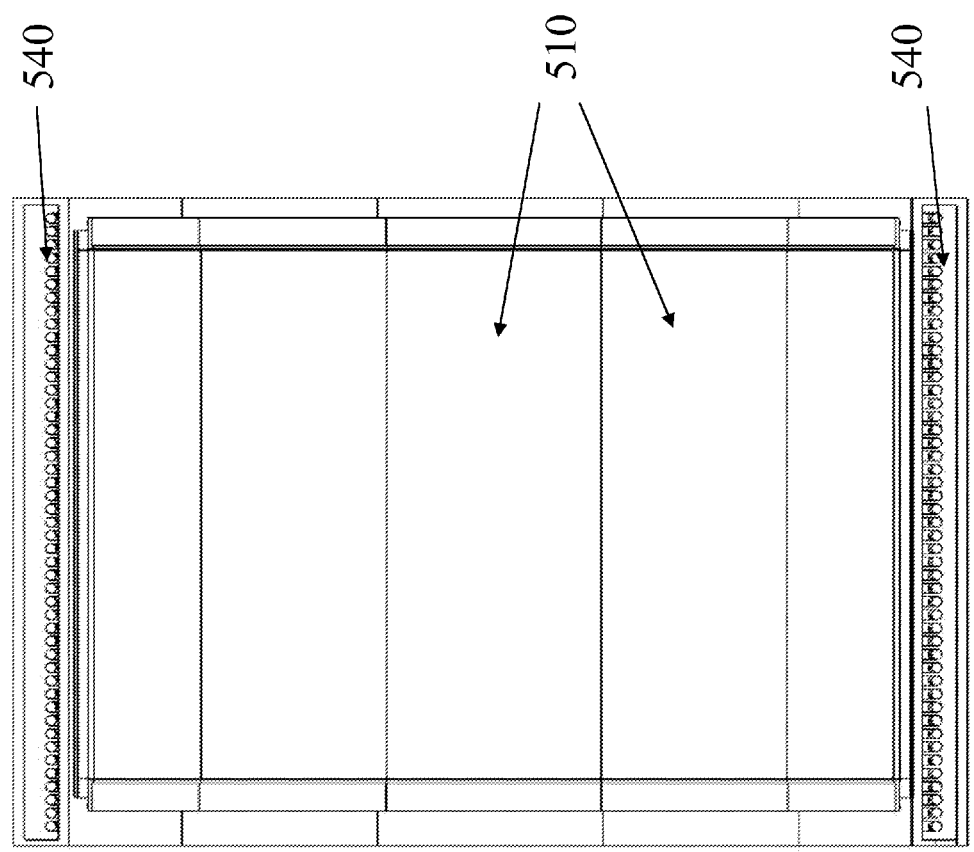

Alternatively, referring to FIG. 5C, an electrical coil 540 provides the magnetic field, electrons travel in a loop and form uniform plasma near the surfaces of the deposition sources 510. This uniform plasma can improve sputtering target utilization or PECVD uniformity. The magnetic flux is substantially parallel to the target or shower head surface, and a large plasma area is formed. The reduced plasma heating per unit area can allow higher deposition rate and reduced target temperature in sputtering.

Figure 5D:
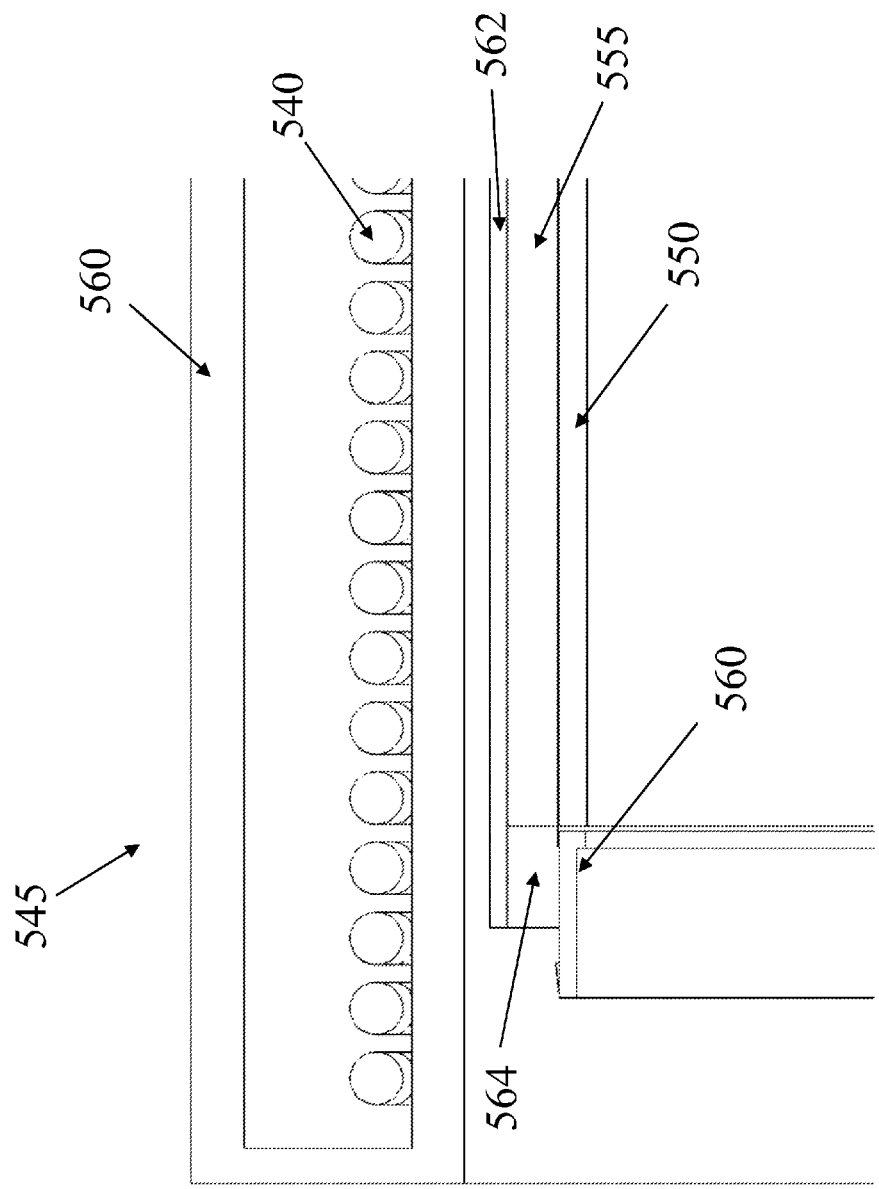
Figure 5E:
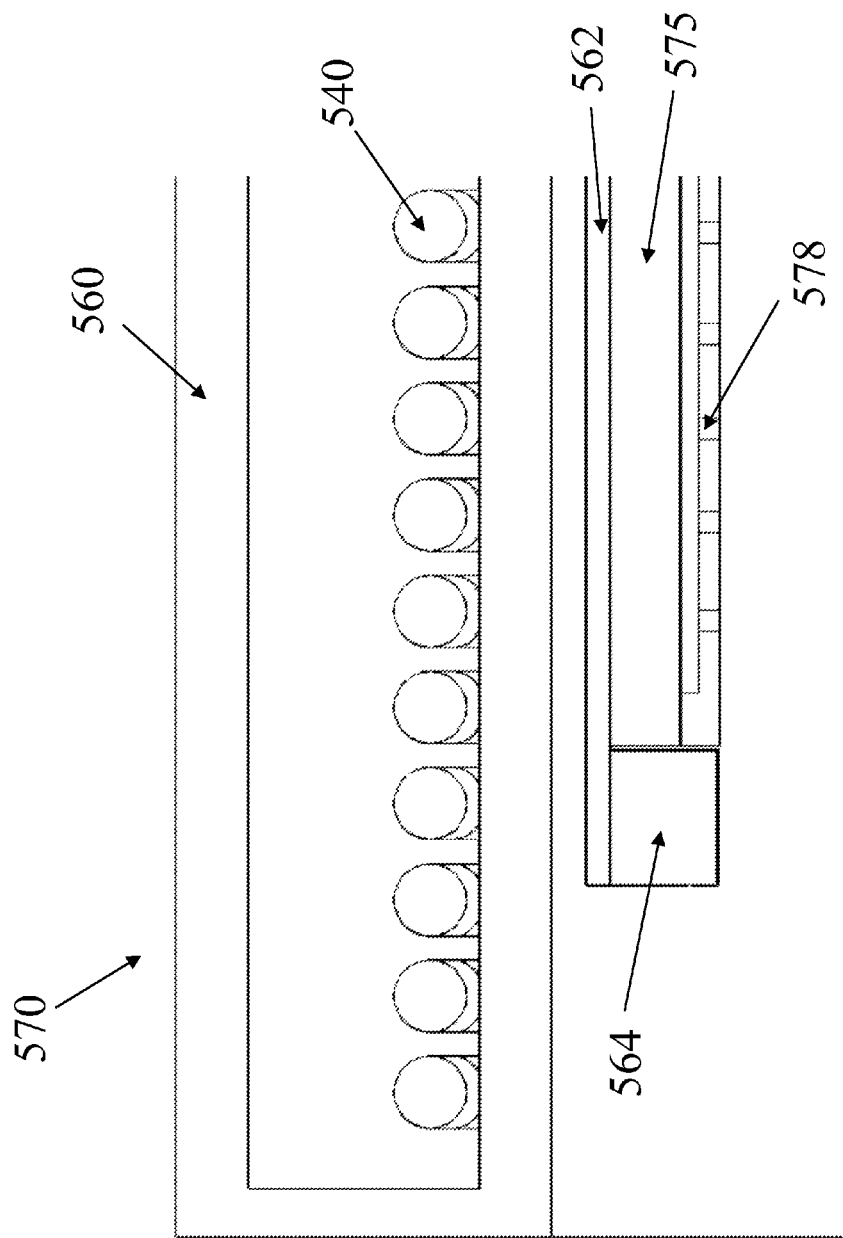

FIG. 5D shows a detailed design of a PVD source 545 comprising a target 550, a backing plate 555, anode shields 560, a backing plate insulator 562, and side insulators 564, and electrical coils 540 in a cooling container 560. In a PECVD source 570, the targets 550 are replaced by shower heads as shown in FIG. 5E, where incoming process gases are fed to the gas distribution plate 575 to minimize impact of flow differentials between inlet and more distant locations. A shower head 578 further evens out the flow rate and provide an electrode for plasma formation. The backing plate insulator 562 and the side insulator 564 confine plasma to the shower head region. The electrical coil 540 is optional and can increase plasma density and lower the operating pressure.

Figure 5F:
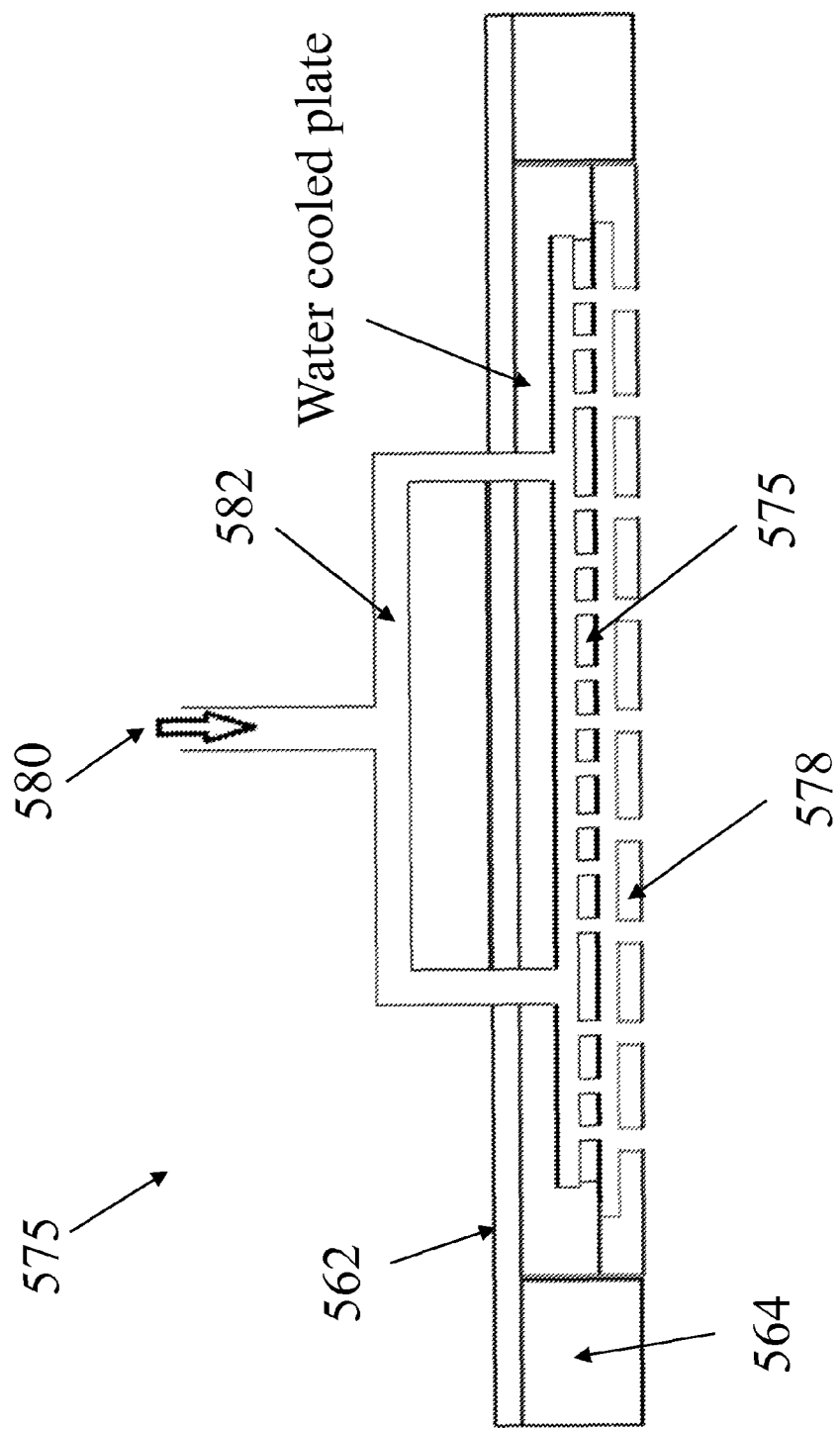

FIG. 5F shows more details of the gas distribution plate 575, where the incoming gas 580 are spread out evenly through symmetrically placed gas lines 582 and a gas distribution plate(s) 575 with specially tuned hole pattern with lower hole opening areas near the inlet. Since substrate carriers (not shown) moves through the deposition sources 570 (FIG. 5E), the deposition source 570 (FIG. 5E) does not have to be wider than substrate carrier to maintain deposition uniformity, the shower head 578 can have a length extended or shortened according to throughput needs, wherein the length is defined as the dimension along the substrate movement direction. The deposition source can be divided into end sections and one or more middle sections, each with its own gas inlet. The deposition source can then be flexibly lengthened or shortened by one or more middle sections and its corresponding gas inlet. When a shorter shower head can be used, the system cost can be reduced since drilling holes on the shower head is one of the major cost of the system.

Figure 6A:
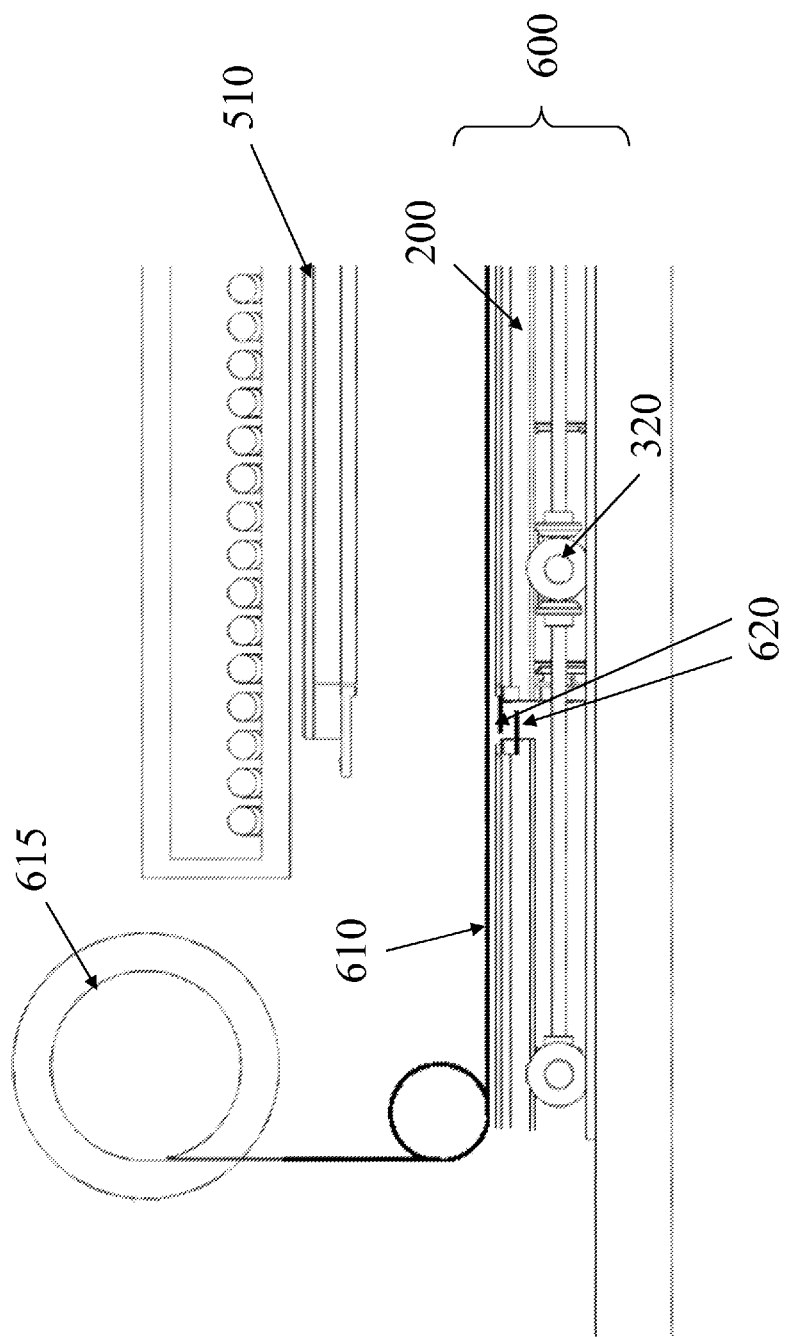
FIGS. 6A-6B illustrate an exemplified shielding mechanism for providing shielding between gaps of the main substrate carriers and the deposition source compatible with the disclosed high throughput deposition apparatus.
Figure 6B:
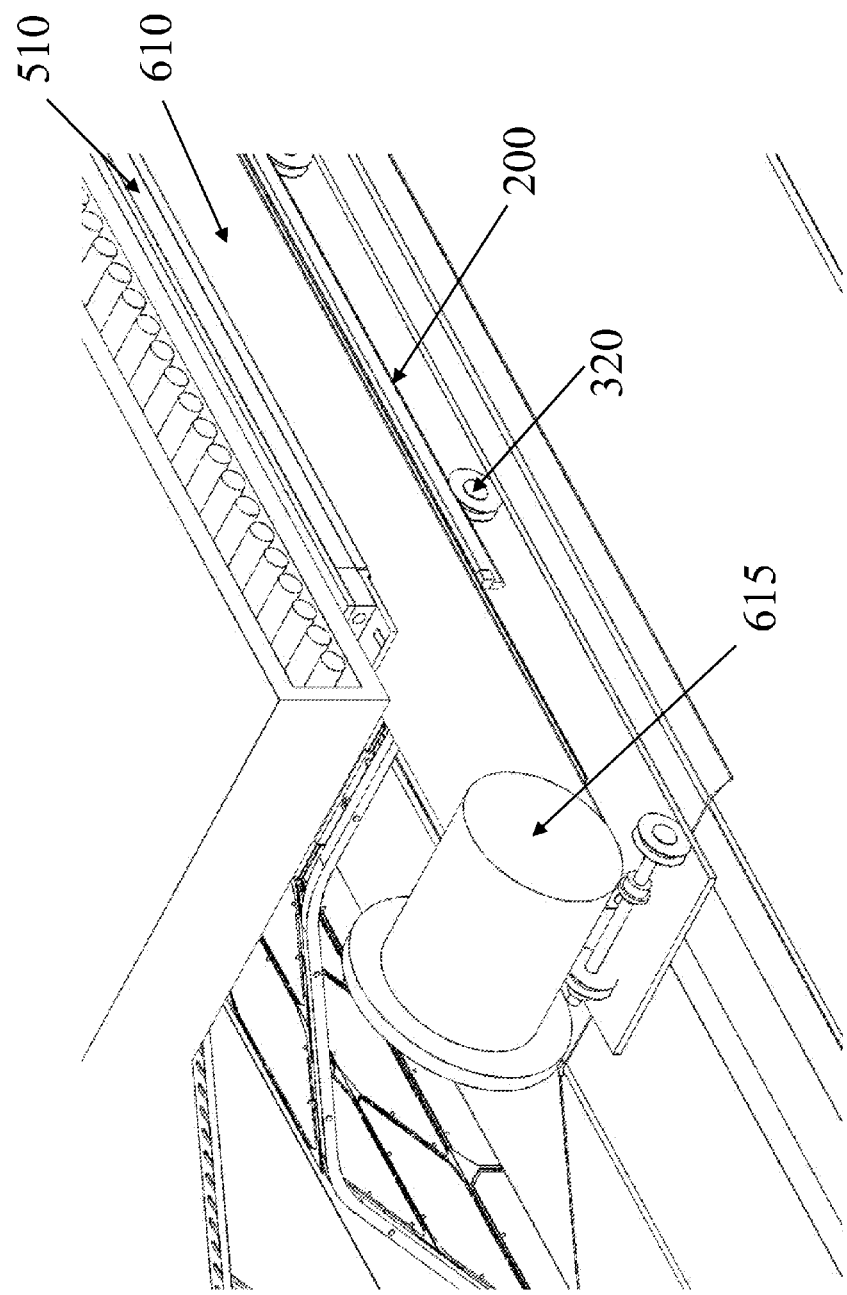

Referring to FIGS. 2A, 2B, 6A and 6B, the gaps 210 between the main carrier 200 can be shielded from the deposition sources 510 by placing shields 600. The shields 600 can be a web 610 fed from a roll 615 to spread out the deposited materials and reduce the shield change frequency. Due to the accuracy of moving mechanism, gaps are needed between carriers to prevent collisions. There are shields that are mounted at different radial position but include overlapping portions 620 in the direction of carrier movement (i.e. the axial direction 105) to prevent deposition into the center region of the chamber or the backside of substrates. FIG. 6B also shows the driving wheels 320 that are rotated by external motor(s) and, optionally through mechanical linkages, to move the main carrier 200.

In a sputtering system, shields are placed around sputtering targets to prevent deposition on deposition chambers and collect deposition materials. These shields have to be replaced to prevent excess material build up and particulate formation. Another advantage of the deposition system is that the deposition source has only two ends, instead of four in conventional systems. Fewer shields are needed to shield the targets. In one configuration, the shields can be movable webs that allow continuous replacement of active shield surfaces.

Figure 7A:
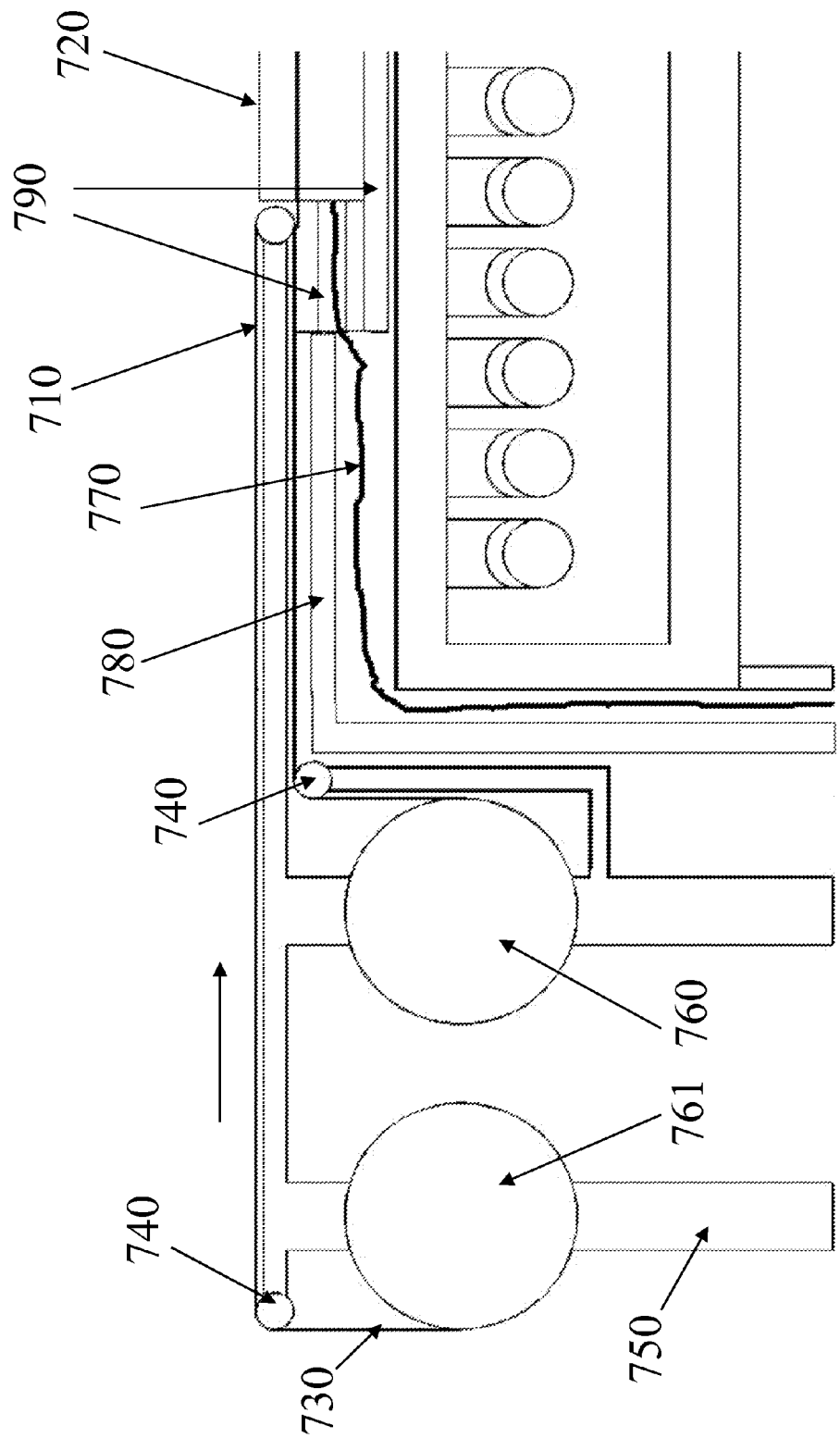
FIGS. 7A-7C illustrate an exemplified roll-to-roll anode shielding mechanism compatible with the disclosed high throughput deposition apparatus.
Figure 7B:
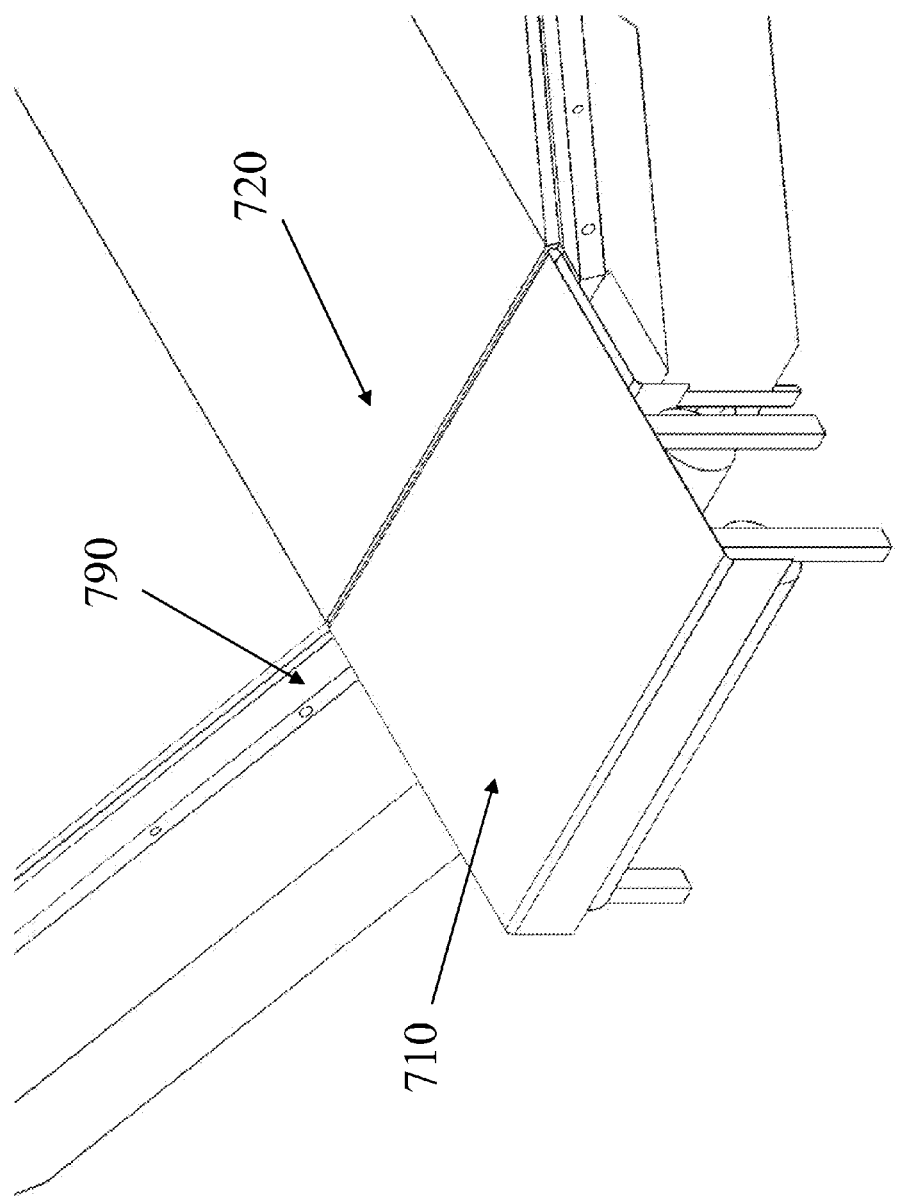
Figure 7C:
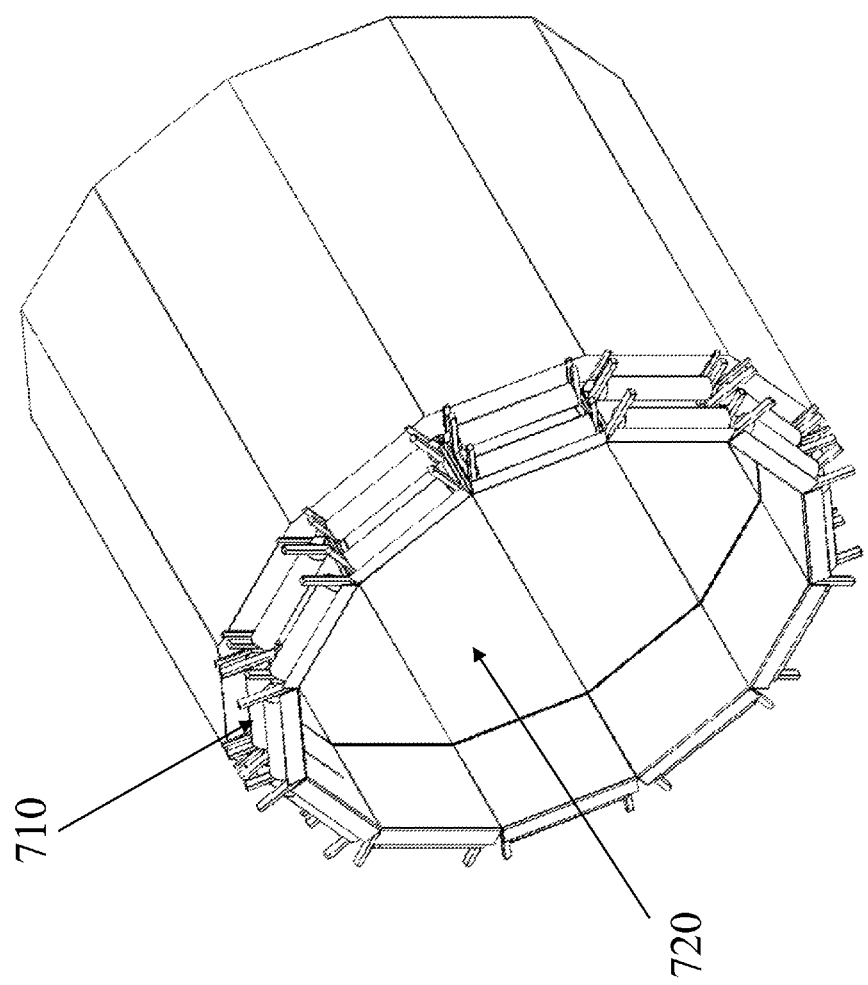

FIGS. 7A and 7B show a roll-to-roll anode shield 710 compatible with the disclosed high throughput deposition apparatus. The roll-to-roll anode shield 710 is positioned next to a sputtering target 720 that advances as it gets coated. An anode is configured to provide an electric potential bias in the sputtering target 720. A shield foil 730 is supported by rollers 740 mounted on supporting structures 750 and can be advanced by winding and un-winding wheels 760, 761. There are little or small gaps beyond the neighboring anode shields 710 to prevent deposition behind the anode shields 710. There are rooms for the necessary electrical connection 770 and cooling water connection 780. Cooling water is needed to cool down the sputtering target or PECVD shower head since large amount of power are applied to deposition sources. FIG. 7C shows that all anode shields 710 are installed. The winding rollers 760 can be connected to each other and can be driven by one motor as an option. An insulator 790 is used to prevent plasma formation in the back side and sides of the target 720.

In a continuous moving deposition system, referring back to FIGS. 1A-1D, one or more pairs substrate carriers can be mounted in entrance load lock, pumped down, moved to an optional entrance buffer chamber where substrates can be heated or cleaned, moved to a larger process chamber where the carriers start a constant speed movement through deposition sources, and then convert back to discrete movement through optional process buffer chambers, and then move continuous through more process chambers if different process or/and process environment are required. The carriers are then moved through an optional exit buffer chambers and exit load lock where the carriers are moved out after venting. Individual carrier movement is translated from discrete loading into continuous movement during deposition with small gaps between carriers to maximize system throughput and deposition consistency. The optional buffer chambers provide vacuum or process isolations between chambers to reduce cross-contaminations, and serves as staging area between gate valves to facilitate discrete movement to clear gate valves and continuous movement for processing.

The small gaps between carriers can be further shielded by overlapping but non-touching shield mounted on carriers. Most materials leaving the deposition sources are deposited on substrate carriers and its shields which can be cleaned outside the vacuum system, the moving deposition shields above and below the gaps between substrate carriers, other deposition sources which can be re-sputtered in case of sputtering or chemical cleaned in case of CVD, or the moving anode shields. The moving shields can be advanced to spread out the deposition and avoid particulates formation. There are very little materials deposited inside the deposition system.

In the case of sputtering using scanning magnetron, there is only one magnet loop required. The sputtering erosion region can be wide by using wider magnet and has minimum impact on material utilization if a wide target is also used. The magnetic field strength can be quite strong and a much thicker target can be used compared with conventional planar or rotary targets. The thicker and wider target reduces the frequency to replace the target. Electrical magnets allow even thicker targets. Combined with reduction in deposition on the deposition chamber surface, the system down time due to target changes and shield changes is also greatly reduced. In addition, the maintenance labor and cost such as target bonding, recalibration and system qualification, system burn-in and wasted substrates are reduced. A large plasma area combined with stronger magnetic field achievable in present invention will lower the voltage on sputtering target of shower head, reducing the damages caused by energetic ions and electrons.

Even with little needs to open deposition system to replace targets or shields, it may still be needs for opening the system to clear out broken or dropped substrates or other debris. The present invention uses transport wheels well above the lowest point of the system and has little horizontal area to avoid catching falling debris or substrates. The gate valve can also be made to have little or no horizontal surfaces so that falling debris will slide off the valve to the bottom of the system.

Figure 8A:
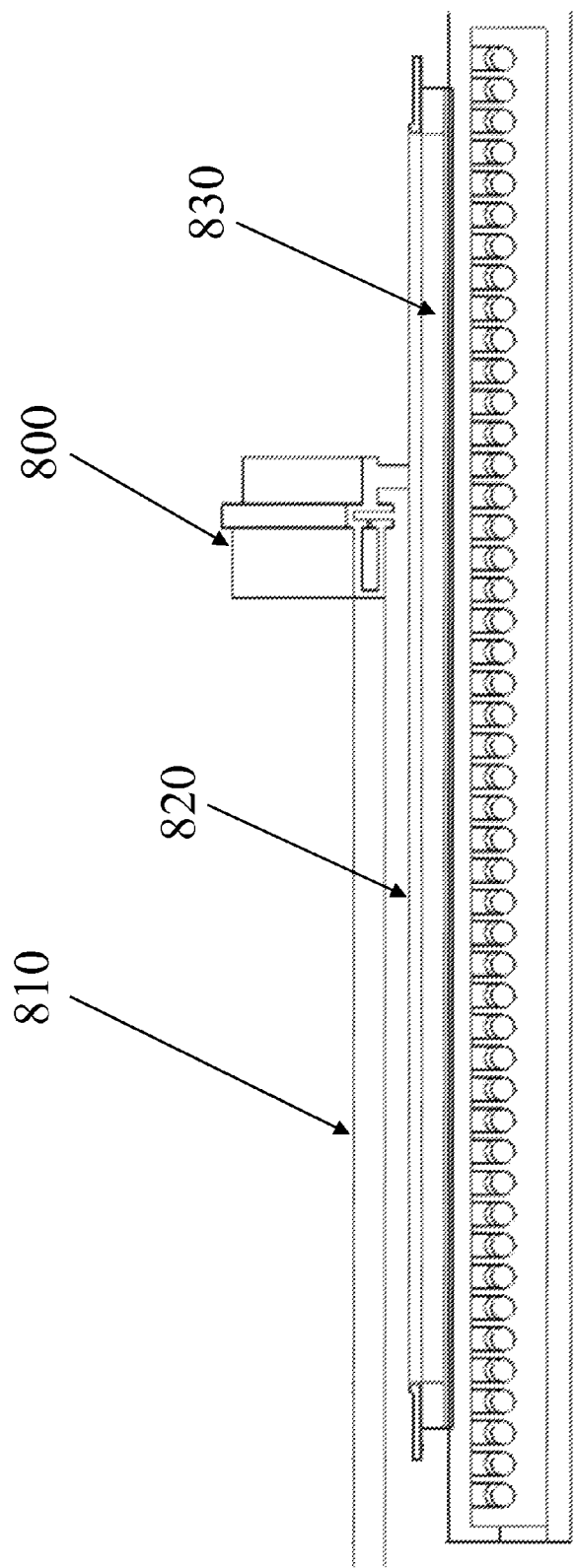
FIGS. 8A-8C illustrate an exemplified mechanism for cleaning deposition surfaces of the deposition sources compatible with the disclosed high throughput deposition apparatus.
Figure 8B:
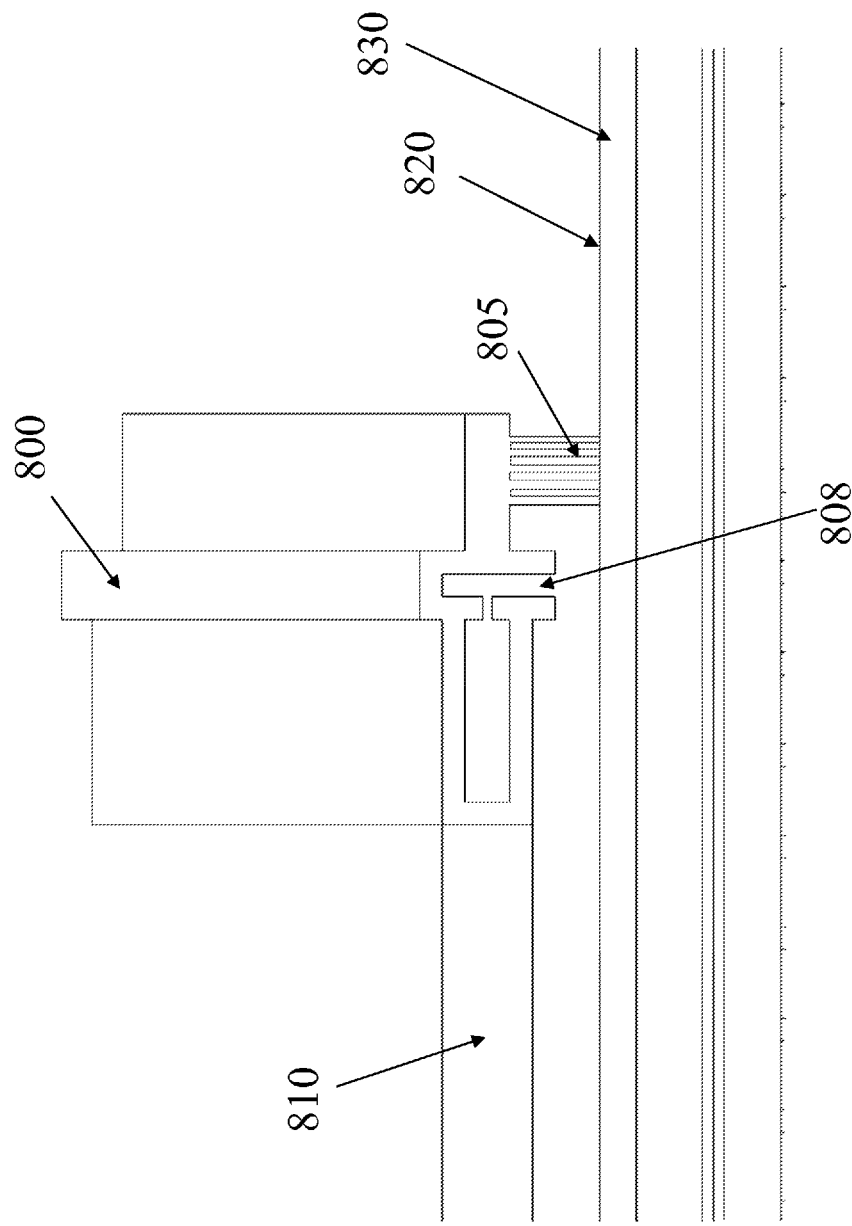
Figure 8C:
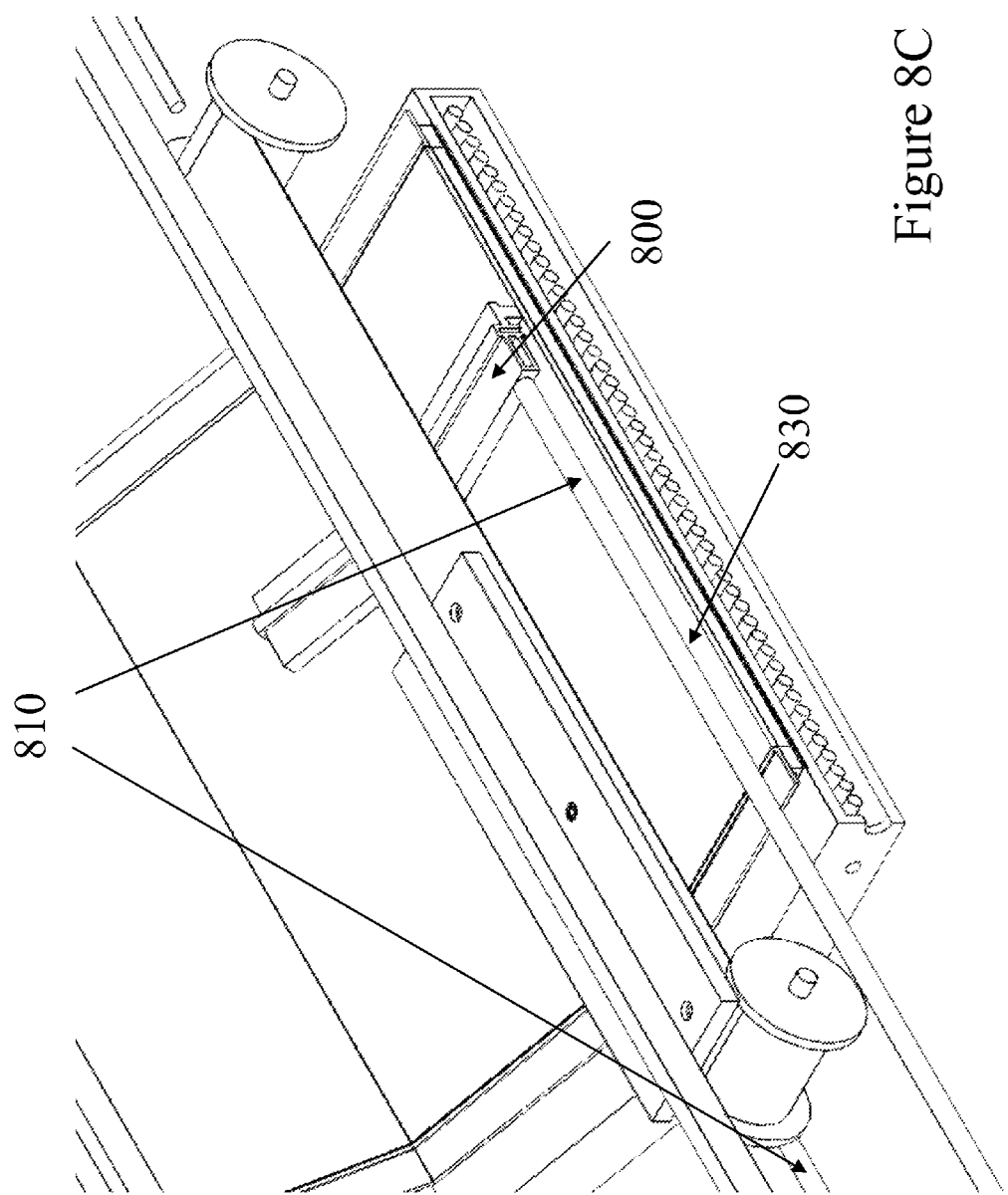

However, substrates or other debris can still drop on lower deposition source surfaces, and contaminate deposition. In addition, particulate or nodules can form on the source surfaces, requiring manual cleaning with mechanical forces. The presently the disclosed high throughput deposition apparatus allows a mechanism to move into the deposition source areas and clean the surfaces. FIGS. 8A-8C show such configurations. A sweeper attachment 800 can include brushes 805, polishing wheels (not shown), high velocity gas blower 808, or a vacuum cleaner (not shown) are attached to a moving arm 810 that sweep the surface 820 of the sputtering target 830. The moving arm 810 is moved out of the source area and stowed away from deposition surfaces 820 during deposition operation. During maintenance or if there is debris on target surface, the sweeper attachment 800 will move into the target surface area and sweep any debris off the target surface. If there is debris attached to the target surface strongly, a polishing wheel can rotate and clean the surface.

Only a few examples and implementations are described. Other implementations, variations, modifications and enhancements to the described examples and implementations may be made without deviating from the spirit of the present invention. For example, the disclosed deposition apparatus are compatible with other spatial configurations for the substrate, the deposition source, and substrate movement directions than the examples provided above. In CVD or PECVD applications, a magnetic field is optional.

What is claimed is:

1. A high throughput deposition apparatus, comprising: a first process chamber;
   a plurality of first deposition sources in the first process chamber, wherein each of the first deposition sources is a sputter source configured to deliver a first deposition material toward a central region in the first process chamber:
   a first main carrier comprising a plurality of first sub-carriers each configured to carry one or more substrates facing outward and configured to receive the first deposition material from the plurality of first deposition sources, wherein the first main carrier comprises a first rail edge in an axial direction;
   a second main carrier comprising a plurality of second sub-carriers each configured to carry one or more substrates facing outward and configured to receive the first deposition material from the plurality of first deposition sources, wherein the second main carrier comprises a second rail edge in the axial direction;
   wherein the first main carrier and the second main carrier form an inner closed loop that defines a cylindrical space therein along the axial direction, and the plurality of first deposition sources form an outer closed loop outside and around the inner closed loop; and
   a transport mechanism configured to move the first main carrier and the second main carrier along the axial direction through the first process chamber, wherein the transport mechanism comprises wheels configured to roll along the first rail edge and the second rail edge, which respectively move the first main carrier and the second main carrier along the axial direction.

2. The high throughput deposition apparatus of claim 1, wherein the first sub-carriers define a first curved surface around the axial direction.

3. The high throughput deposition apparatus of claim 1, wherein the second sub-carriers define a second curved surface around the axial direction.

4. The high throughput deposition apparatus of claim 1, wherein the first main carrier and the second main carrier are separated by a gap aligned along the axial direction.

5. The high throughput deposition apparatus of claim 4, wherein the first rail edge and the second rail edge are separated by the gap.

6. The high throughput deposition apparatus of claim 4, further comprising:
   a deposition shield positioned between the gap on sides of the first main carrier and the second main carrier opposite to the plurality of first deposition sources, wherein the deposition shield is configured to block a portion of the first deposition material from the plurality of first deposition sources.

7. The high throughput deposition apparatus of claim 6, wherein the deposition shield comprises a web that is moveable by one or more rollers.

8. The high throughput deposition apparatus of claim 1, wherein the plurality of first deposition sources comprise:
   a sputtering target; and
   an anode configured to provide an electric potential bias in the sputtering target, wherein the high throughput deposition apparatus further comprising:
   an anode shield comprising a web that is moveable by one or more rollers.

9. The high throughput deposition apparatus of claim 1, wherein the first sub-carriers are defined by polygon shaped surfaces positioned around the axial direction.

10. The high throughput deposition apparatus of claim 1, further comprising:
    a rotation mechanism is configured to rotate at least one of the plurality of first sub-carriers and one of the one or more substrates carried by one of the plurality of first sub-carriers.

11. The high throughput deposition apparatus of claim 1, wherein at least one of the plurality of first sub-carriers is configured to carry two substrates on two opposing surfaces of one of the plurality of first sub-carriers.

12. The high throughput deposition apparatus of claim 1, wherein the plurality of first deposition sources comprise a sputtering target, the high throughput deposition apparatus further comprising:
    a cleaning apparatus configured to clean a sputtering surface of the sputtering target, wherein the cleaning apparatus includes a brush, a polishing wheel, a gas blower, or a vacuum cleaner.

13. The high throughput deposition apparatus of claim 1, further comprising:
    an entrance load lock chamber; and
    an entrance buffer chamber that connects the entrance load lock chamber and the first processing chamber, wherein transport mechanism configured to move the first main carrier along the axial direction through the entrance load lock chamber, entrance buffer chamber, and the first process chamber.

14. The high throughput deposition apparatus of claim 1, further comprising:
- a first gate valve at an entrance to the first process chamber, wherein the first gate valve is configured to open to allow the first main carrier to move into the first process chamber, wherein the first gate valve is configured to close to provide vacuum seal for the first process chamber; and
- a second gate valve at an exit to the first process chamber, wherein the second gate valve is configured to open to allow the first main carrier to move out of the first process chamber, wherein the second gate valve is configured to close to provide vacuum seal for the first process chamber.

15. The high throughput deposition apparatus of claim 14, wherein at least one of the first gate valve and the second gate valve includes two half circles or half polygons configured to open and close.

16. The high throughput deposition apparatus of claim 1, further comprising:
- a heater in an entrance buffer chamber and configured to heat the first sub-carriers in the first main carrier.

17. The high throughput deposition apparatus of claim 1, further comprising:
- a second process chamber; and
- one or more second deposition sources in the second process chamber;
- wherein each of the first sub-carriers is configured to carry a substrate configured to receive a second deposition material from the one or more second deposition sources,
- wherein the transport mechanism configured to move the first main carrier along the axial direction through the second process chamber.

18. The high throughput deposition apparatus of claim 17, further comprising:
- a process buffer chamber between the first process chamber and the second process chamber,
- wherein the transport mechanism configured to move the first main carrier along the axial direction through the process buffer chamber.

19. The high throughput deposition apparatus of claim 17, further comprising:
- an exit lock chamber; and
- an exit buffer chamber between the first process chamber and the exit lock chamber,
- wherein the transport mechanism configured to move the first main carrier along the axial direction through the exit lock chamber and the exit buffer chamber.

20. The high throughput deposition apparatus of claim 1, wherein the plurality of first deposition sources form an outer closed loop around the axial direction.

21. The high throughput deposition apparatus of claim 20, wherein the plurality of first deposition sources comprise magnets that are distributed in an outer closed loop around the axial direction.

22. The high throughput deposition apparatus of claim 20, wherein the plurality of first deposition sources comprise sputtering targets that are distributed in an outer closed loop around the axial direction.

* * * * *